(12) United States Patent
Choi et al.

(10) Patent No.: US 12,520,693 B2
(45) Date of Patent: Jan. 6, 2026

(54) DISPLAY PANEL AND ELECTRONIC APPARATUS

(71) Applicant: Samsung Display Co., Ltd., Yongin-si (KR)

(72) Inventors: Nakcho Choi, Yongin-si (KR); Daegi Kweon, Yongin-si (KR); Jihee Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 844 days.

(21) Appl. No.: 17/671,502

(22) Filed: Feb. 14, 2022

(65) Prior Publication Data
US 2022/0302421 A1 Sep. 22, 2022

(30) Foreign Application Priority Data

Mar. 18, 2021 (KR) .................. 10-2021-0035349

(51) Int. Cl.
| | |
|---|---|
| H10K 59/38 | (2023.01) |
| H10K 59/40 | (2023.01) |
| H10K 59/65 | (2023.01) |
| H10K 59/80 | (2023.01) |
| H10K 59/131 | (2023.01) |

(52) U.S. Cl.
CPC ............ *H10K 59/38* (2023.02); *H10K 59/40* (2023.02); *H10K 59/65* (2023.02); *H10K 59/8792* (2023.02); *H10K 59/131* (2023.02); *H10K 59/873* (2023.02)

(58) Field of Classification Search
CPC ...... H10K 50/84; H10K 50/865; H10K 59/10; H10K 59/131; H10K 59/30; H10K 59/35; H10K 59/38; H10K 59/40; H10K 59/65; H10K 59/873; H10K 59/8792
See application file for complete search history.

(56) References Cited

U.S. PATENT DOCUMENTS

| | | |
|---|---|---|
| 9,985,080 B2 | 5/2018 | Choi et al. |
| 10,566,404 B2 | 2/2020 | Sato |
| 10,854,690 B2 | 12/2020 | Bae et al. |
| 10,896,939 B2 | 1/2021 | Jeon et al. |
| 11,081,532 B2 | 8/2021 | Lee et al. |
| 11,114,511 B2 | 9/2021 | Choi et al. |
| 11,437,458 B2 | 9/2022 | Chung et al. |
| 2016/0181333 A1 | 6/2016 | Park et al. |
| 2019/0377233 A1* | 12/2019 | Park .................. G02F 1/136286 |

(Continued)

FOREIGN PATENT DOCUMENTS

| | | |
|---|---|---|
| CN | 110112176 A | 8/2019 |
| CN | 111063719 A | 4/2020 |

(Continued)

*Primary Examiner* — Brook Kebede
(74) *Attorney, Agent, or Firm* — Womble Bond Dickinson (US) LLP

(57) ABSTRACT

A display panel includes: a first display area including display element groups in which first light-emitting diodes are arranged and a transmission area; a second display area surrounding at least a portion of the first display area and having second light-emitting diodes arranged therein; and a first light-shielding insulating layer on the first display area and defining an emission area of the first light-emitting diodes, wherein the first light-shielding insulating layer has an isolated pattern in a plan view.

32 Claims, 22 Drawing Sheets

(56) References Cited

U.S. PATENT DOCUMENTS

2020/0241705 A1\*  7/2020  Kim .................... H10K 50/865
2021/0359047 A1  11/2021  Yoon et al.

FOREIGN PATENT DOCUMENTS

| CN | 111710276 A | 9/2020 |
|---|---|---|
| CN | 111725287 A | 9/2020 |
| KR | 10-2016-0017388 A | 2/2016 |
| KR | 10-2016-0076034 A | 6/2016 |
| KR | 10-2019-0096472 A | 8/2019 |
| KR | 10-2020-0083745 A | 7/2020 |
| KR | 10-2020-0099251 A | 8/2020 |
| KR | 10-2020-0135637 A | 12/2020 |
| KR | 10-2021-0024292 A | 3/2021 |
| KR | 10-2021-0142808 A | 11/2021 |

\* cited by examiner

DISPLAY PANEL AND ELECTRONIC APPARATUS

CROSS-REFERENCE TO RELATED APPLICATION

The present application claims priority to and the benefit of Korean Patent Application No. 10-2021-0035349, filed on Mar. 18, 2021, in the Korean Intellectual Property Office, the entire disclosure of which is incorporated herein by reference.

BACKGROUND

1. Field

Aspects of one or more embodiments relate to a display panel and an electronic apparatus including the same.

2. Description of the Related Art

Recently, display panels have been used for various purposes. Also, as display panels have become thinner and more lightweight, the range of uses and applications for display panels has expanded.

As the area occupied by a display area in display panels has been expanded, various additional functions have been combined with or linked to display panels. In order to increase the area and add various functions to display panels, display panels having an area for adding various functions other than displaying images in the display area have been studied.

The above information disclosed in this Background section is only for enhancement of understanding of the background and therefore the information discussed in this Background section does not necessarily constitute prior art.

SUMMARY

Components such as cameras or sensors may be arranged to add various functions. In order to arrange components while enabling a display area having a relatively larger area, the components may overlap the display area. As one method to arrange the components, a display panel may include a transmission area through which a wavelength such as light, sound, or other visible or non-visible spectrum wireless signals may be transmitted. One or more embodiments include a display panel having the aforementioned characteristics and an electronic apparatus including the same.

Additional aspects will be set forth in part in the description that follows and, in part, will be apparent from the description, or may be learned by practice of the embodiments of the disclosure.

According to one or more embodiments, a display panel includes a first display area including display element groups in which first light-emitting diodes are arranged and a transmission area, a second display area surrounding at least a portion of the first display area and having second light-emitting diodes arranged therein, and a first light-shielding insulating layer arranged on the first display area and defining an emission area of each of the first light-emitting diodes, wherein, on a plane, the first light-shielding insulating layer has an isolated pattern.

According to some embodiments, the display panel may further include a first light-shielding layer and a first color filter, which are arranged on the first light-shielding insulating layer.

According to some embodiments, the first light-shielding insulating layer may include first openings corresponding to the first light-emitting diodes, and the first light-shielding layer may include second openings overlapping the first openings.

According to some embodiments, the first color filter may be positioned in each of the second opening.

According to some embodiments, the display panel may further include a first wire and a second wire, which are arranged on the first display area.

According to some embodiments, at least one of the first wire or the second wire may be between adjacent display element groups among the display element groups in the first display area, and the first light-shielding insulating layer may not be arranged on at least one of the first wire or the second wire.

According to some embodiments, at least a portion of the first light-shielding layer may be arranged on the first wire and the second wire.

According to some embodiments, the display panel may further include a second color filter arranged on the first light-shielding layer, wherein the second color filter may at least partially overlap at least one of the first wire or the second wire.

According to some embodiments, the second color filter may be a red color filter.

According to some embodiments, the first light-shielding layer may include a third opening corresponding to the transmission area.

According to some embodiments, the display panel may further include an overcoat layer arranged on the first light-shielding layer and the first color filter.

According to some embodiments, at least a portion of the overcoat layer may be arranged in the third opening.

According to some embodiments, the display panel may further include a spacer arranged on the first light-shielding insulating layer.

According to some embodiments, the display panel may further include an encapsulation layer arranged on the first light-emitting diodes and an input sensing layer arranged on the encapsulation layer, wherein the input sensing layer may include a first metal layer and a second metal layer.

According to some embodiments, the first light-shielding layer may cover the second metal layer.

According to some embodiments, the display panel may further include a second light-shielding insulating layer defining an emission area of each of the second light-emitting diodes, and a second light-shielding layer and a third color filter, which are arranged on the second light-shielding insulating layer.

According to some embodiments, the second light-shielding insulating layer and the first light-shielding insulating layer may include a same material.

According to some embodiments, the second light-shielding insulating layer may include fourth openings corresponding to the second light-emitting diodes, and the second light-shielding layer may include fifth openings overlapping the fourth openings.

According to some embodiments, the third color filter may be positioned in each of the fifth openings.

According to some embodiments, an electronic apparatus includes a display panel including a first display area and a second display area, wherein the first display area includes display element groups in which first light-emitting diodes are arranged and a transmission area, and the second display area at least partially surrounds the first display area and has second light-emitting diodes arranged therein, and a component arranged on a lower surface of the display panel and at least partially overlapping the first display area, wherein the display panel includes a first light-shielding insulating layer arranged on the first display area and defining an emission area of each of the first light-emitting diodes, and, on a plane, the first light-shielding insulating layer has an isolated pattern.

According to some embodiments, the electronic apparatus may further include a first light-shielding layer and a first color filter, which are arranged on the first light-shielding insulating layer.

According to some embodiments, the first light-shielding insulating layer may include first openings corresponding to the first light-emitting diodes, and the first light-shielding layer may include second openings overlapping the first openings.

According to some embodiments, the first color filter may be positioned in each of the second openings.

According to some embodiments, the electronic apparatus may further include a first wire and a second wire, which are arranged on the first display area.

According to some embodiments, at least one of the first wire or the second wire may be between adjacent display element groups among the display element groups in the first display area, and the first light-shielding insulating layer may not be arranged on at least one of the first wire or the second wire.

According to some embodiments, at least a portion of the first light-shielding layer may be arranged on the first wire and the second wire.

According to some embodiments, the display panel may further include a second color filter arranged on the first light-shielding layer, wherein the second color filter may at least partially overlap at least one of the first wire or the second wire.

According to some embodiments, the first light-shielding layer may include third openings corresponding to the transmission area.

According to some embodiments, the electronic apparatus may further include an overcoat layer arranged on the first light-shielding layer and the first color filter.

According to some embodiments, at least a portion of the overcoat layer may be arranged in each of the third openings.

According to some embodiments, the electronic apparatus may further include a spacer arranged on the first light-shielding insulating layer.

According to some embodiments, the component may include a sensor or a camera.

Other aspects, features, and characteristics of some embodiments of the disclosure will become more apparent from the drawings, the claims, and the detailed description.

BRIEF DESCRIPTION OF THE DRAWINGS

The above and other aspects, features, and characteristics of some embodiments of the present disclosure will be more apparent from the following description taken in conjunction with the accompanying drawings, in which.

DETAILED DESCRIPTION

Figure 1:
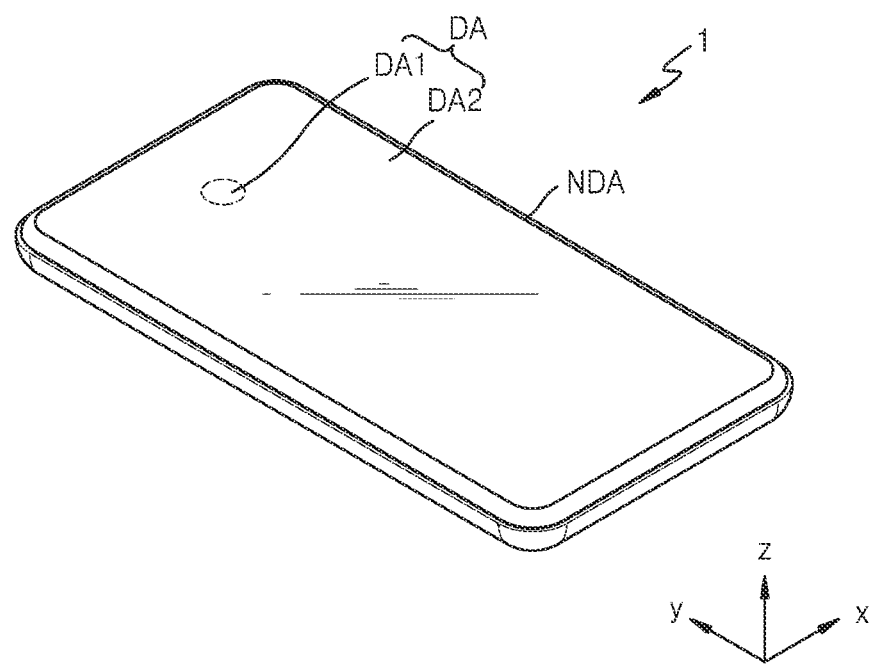
FIG. 1 is a schematic perspective view of an electronic apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in more detail with reference to the drawings. However, the disclosure is not limited to the following embodiments and may be embodied in various forms.

It will be understood that although the terms "first," "second," etc. may be used herein to describe various elements, these elements should not be limited by these terms. These terms are only used to distinguish one element from another.

In the following embodiments, the singular forms include the plural forms unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it may be directly on the other layer, region, or element, or may be indirectly on the other layer, region, or element with intervening layers, regions, or elements therebetween.

Sizes of elements in the drawings may be exaggerated or contracted for convenience of explanation. In addition, because sizes and thicknesses of elements in the drawings are arbitrarily illustrated for convenience of explanation, the disclosure is not limited thereto.

In the present specification, an expression such as "A and/or B" indicates A, B, or A and B. Also, an expression such as "at least one of A and B" indicates A, B, or A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, when an element is referred to as being "on a plane," it is understood that an element is viewed from the top, and when an element is referred to as being "on a cross-section," it is understood that the element is vertically cut and viewed from the side. In the following embodiments, when elements "overlap" each other, the elements overlap "on a plane" and "a cross-section."

Hereinafter, embodiments will be described with reference to the accompanying drawings, and those elements that are the same or are in correspondence with each other are rendered the same reference numeral in the drawings.

FIG. 1 is a schematic perspective view of an electronic apparatus 1 according to some embodiments.

The electronic apparatus 1 according to some embodiments is an apparatus that displays a moving picture or a still image, and may be used not only in mobile phones, smart phones, tablet personal computers (PCs), mobile communication terminals, electronic notebooks, electronic books, portable multimedia players (PMPs), navigations, and ultra-mobile PCs (UMPCs), but also in a display screen of various products such as televisions, laptops, monitors, billboards, and Internet of things (IoT) apparatuses. The electronic apparatus 1 according to some embodiments may also be used in wearable apparatuses, such as smart watches, watch phones, glasses-type displays, or head mounted displays (HMDs). The electronic apparatus 1 according to some embodiments may also be used as, or incorporated into, dashboards of automobiles, center information displays (CIDs) on the center fascia or dashboards of automobiles, room mirror displays that replace side mirrors of automobiles, and displays arranged on the rear sides of front seats to serve as entertainment devices for backseat passengers of automobiles. For convenience of description, FIG. 1 illustrates that the electronic apparatus 1 is used as a smartphone, but embodiments according to the present disclosure are not limited thereto.

Referring to FIG. 1, the electronic apparatus 1 may include a display area DA and a non-display area NDA outside the display area DA. The electronic apparatus 1 may display images through an array of a plurality of pixels that are two-dimensionally arranged in the display area DA.

The non-display area NDA is an area that does not provide an image and may entirely surround the display area DA. That is the non-display area NDA may operate as a bezel area, and may be in a periphery of (e.g., outside a footprint of) the display area DA. In the non-display area NDA, a driver for providing electrical signals or power to display elements arranged in the display area DA may be arranged. In the non-display area NDA, one or more pads, which are areas to which one or more electronic devices, components, or printed circuits board may be electrically connected, may be arranged.

The display area DA may include a first display area DA1 and a second display area DA2. The first display area DA1 is an area in which a component for adding various functions to the electronic apparatus 1 is arranged, and the first display area DA1 may correspond to a component area.

Figure 2:
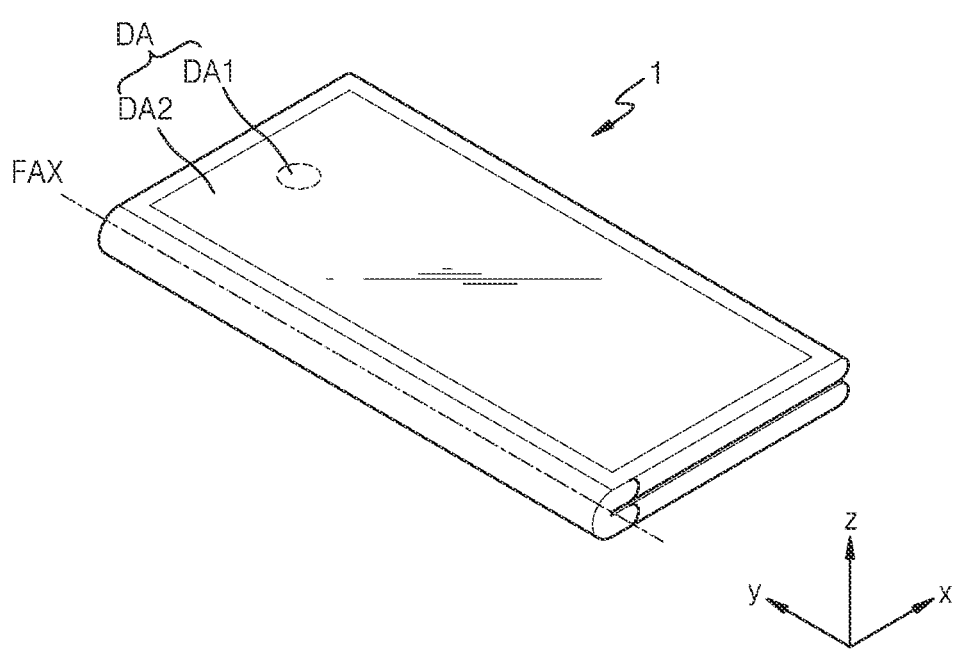
FIG. 2 is a schematic perspective view of an electronic apparatus according to some embodiments.
Figure 3:
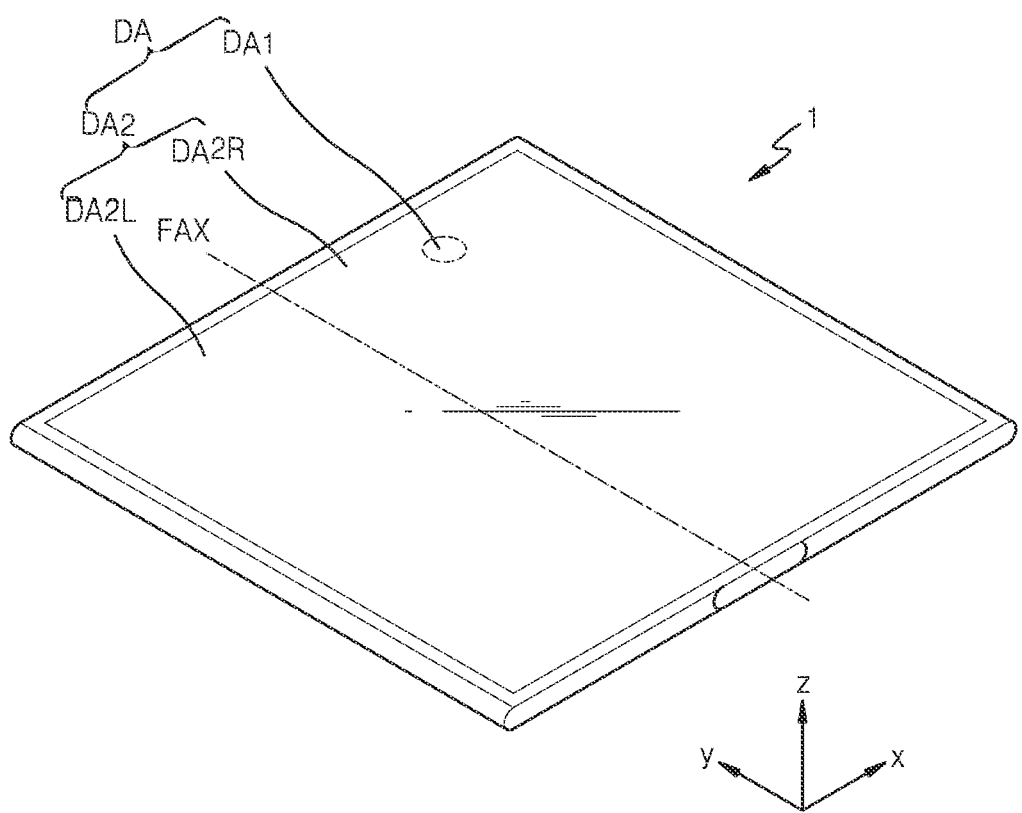
FIG. 3 is a schematic perspective view of an electronic apparatus according to some embodiments.

FIG. 2 is a schematic perspective view of the electronic apparatus 1 according to some embodiments, and FIG. 3 is a schematic perspective view of the electronic apparatus 1 according to some embodiments. For example, FIG. 2 is a schematic perspective view illustrating a state in which a foldable electronic apparatus is folded, and FIG. 3 is a schematic perspective view illustrating a state in which a foldable electronic apparatus is unfolded.

The electronic apparatus 1 according to some embodiments may be a foldable electronic apparatus. The electronic apparatus 1 may be folded with respect to a folding axis FAX. According to some embodiments, the folding axis FAX may be at a location that is fixed or predetermined relative to the overall display area DA. The display area DA may be positioned outside and/or inside the electronic apparatus 1. According to some embodiments, FIGS. 2 and 3 illustrate that the display area DA is positioned outside and inside the electronic apparatus 1, respectively.

Referring to FIG. 2, the display area DA may be arranged outside the electronic apparatus 1. An outer surface of the folded electronic apparatus 1 may include the display area DA, and the display area DA may include the first display area DA1 and the second display area DA2. In this case, the second display area DA2 may occupy most of the display area DA, and the first display area DA1 may have a relatively small area compared to the second display area DA2.

Referring to FIG. 3, the display area DA may be arranged inside the electronic apparatus 1. An inner surface of the unfolded electronic apparatus 1 may include the display area DA, and the display area DA may include the first display area DA1 and the second display area DA2. In this case, the second display area DA2 may occupy most of the display area DA, and the first display area DA1 may have a relatively small area compared to the second display area DA2.

FIG. 3 illustrates that the second display area DA2 includes a left display area DA2L and a right display area DA2R which are arranged at both (e.g., opposite) sides of the folding axis FAX, and the first display area DA1 is arranged inside the right display area DA2R, but embodiments according to the present disclosure are not limited thereto. According to some embodiments, the first display area DA1 may also be arranged inside the left display area DA2L.

Figure 4:
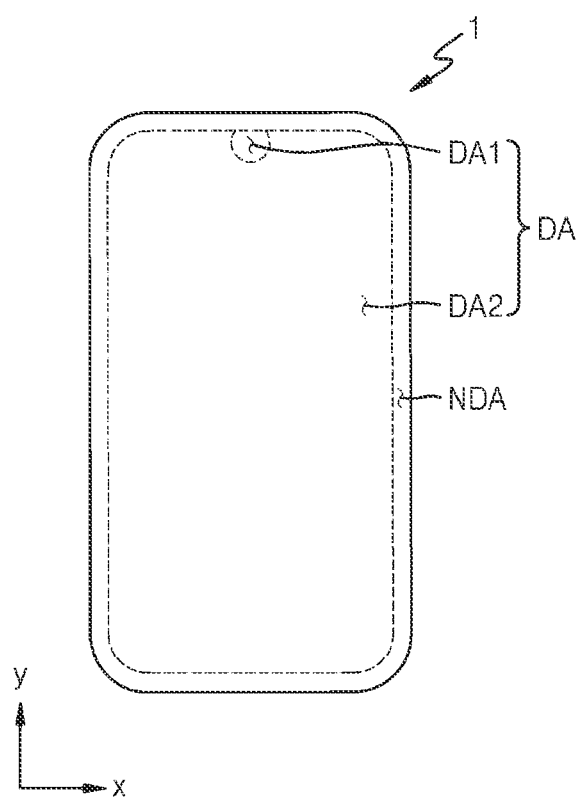
FIG. 4 is a schematic cross-sectional view of an electronic apparatus according to some embodiments.

FIGS. 1, 2, and 3 illustrate that the first display area DA1 is entirely surrounded by the second display area DA2, but embodiments according to the present disclosure are not limited thereto. FIG. 4 is a schematic plan view of the electronic apparatus 1 according to some embodiments, and as illustrated in FIG. 4, the first display area DA1 may be partially surrounded by the second display area DA2.

Figure 5:
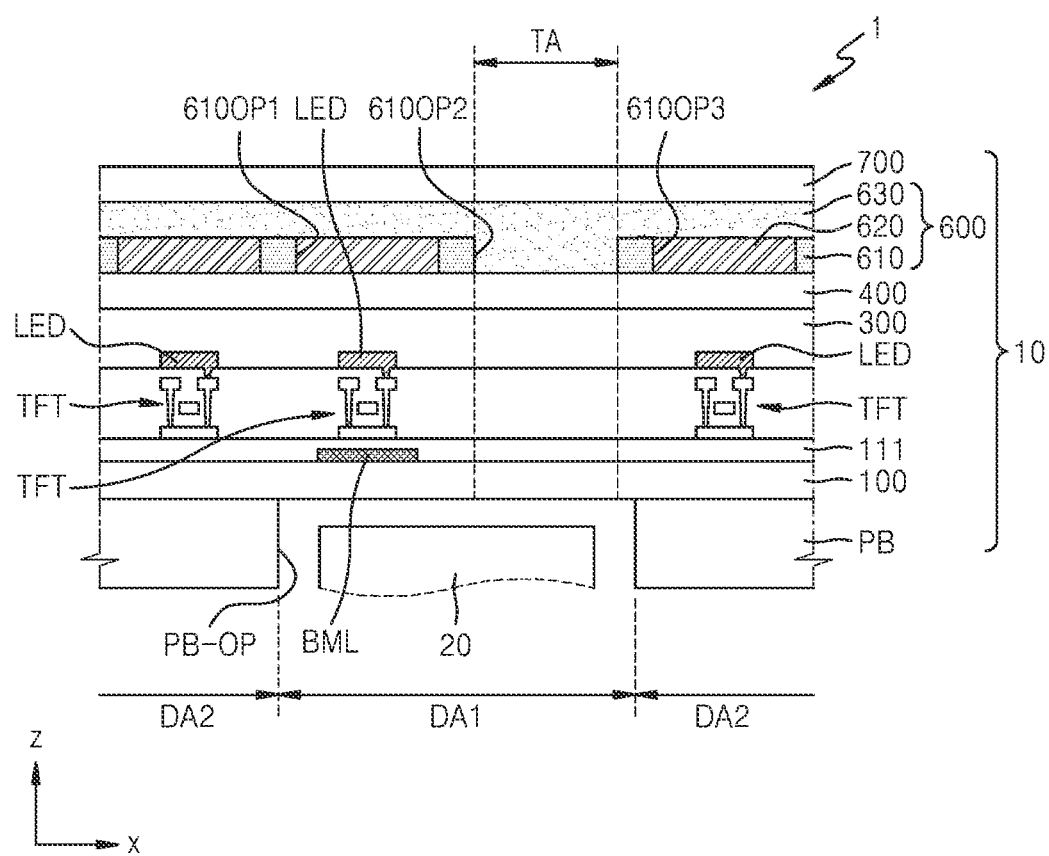
FIG. 5 is a schematic cross-sectional view of an electronic apparatus according to some embodiments.

FIG. 5 is a schematic cross-sectional view of the electronic apparatus 1 according to some embodiments.

Referring to FIG. 5, the electronic apparatus 1 may include a display panel 10 and a component 20 overlapping the display panel 10. In this case, the component 20 may be arranged on a lower surface of the display panel 10, and the component 20 may be positioned in the first display area DA1.

The display panel 10 may include a substrate 100, a thin-film transistor TFT arranged on the substrate 100, a display element (e.g., a light-emitting diode LED) electrically connected to the thin-film transistor TFT, an encapsulation layer 300 covering the display element, an input sensing layer 400, an anti-reflection layer 600, and a window 700.

The substrate 100 may include glass or a polymer resin. The substrate 100 including a polymer resin may be flexible, foldable, rollable, or bendable. The substrate 100 may have a multi-layered structure including a layer including the aforementioned polymer resin and an inorganic layer.

A lower protective film PB may be arranged on a lower surface of the substrate 100. The lower protective film PB may be attached to the lower surface of the substrate 100. An adhesive layer may be between the lower protective film PB and the substrate 100. Alternatively, the lower protective film PB may be directly formed on the lower surface of the substrate 100, and in this case, the adhesive layer may not be between the lower protective film PB and the substrate 100.

The lower protective film PB may support and protect the substrate 100. The lower protective film PB may include an opening PB-OP corresponding to the first display area DA1. The lower protective film PB may include an organic insulating material such as polyethylene terephthalate or polyimide.

The thin-film transistor TFT and the light-emitting diode LED, which is a display element electrically connected to the thin-film transistor TFT, may be arranged on an upper surface of the substrate 100. The light-emitting diode LED may be an organic light-emitting diode including an organic material. The organic light-emitting diode may emit red, green, and blue light.

The light-emitting diode LED may be an inorganic light-emitting diode including an inorganic material. The inorganic light-emitting diode may include a PN junction diode including inorganic semiconductor-based materials. When a voltage is applied to the PN junction diode in a forward direction, holes and electrons may be injected, and energy generated by recombination of the holes and the electrons may be converted into light energy to emit light having a certain color. The aforementioned inorganic light-emitting diode may have a width of several to hundreds of micrometers or several to hundreds of nanometers. According to some embodiments, the light-emitting diode LED may include a quantum dot light-emitting diode. Alternatively, an emission layer of the light-emitting diode LED may include an organic material, an inorganic material, quantum dots, an organic material and quantum dots, or an inorganic material and quantum dots.

The light-emitting diode LED may be electrically connected to the thin-film transistor TFT arranged thereunder. In this regard, FIG. 5 illustrates that a buffer layer 111 is arranged on the substrate 100, and the thin-film transistor TFT is arranged on the buffer layer 111. The thin-film transistor TFT and the light-emitting diode LED electrically connected to the thin-film transistor TFT may be arranged in the first display area DA1 and the second display area DA2, respectively.

A transmission area TA may be positioned in the first display area DA1. The transmission area TA may be an area through which light emitted from the component 20 and/or light directed toward the component 20 may be transmitted. In the display panel 10, a transmittance of the transmission area TA may be about 30% or higher, about 40% or higher, about 50% or higher, about 60% or higher, about 70% or higher, about 75% or higher, about 80% or higher, about 85% or higher, or about 90% or higher.

The component 20 may include a sensor, such as a proximity sensor, an illumination sensor, an iris sensor, a face recognition sensor, and a camera (or image sensor). The component 20 may use light. For example, the component 20 may emit and/or receive light in infrared, ultraviolet, and visible light bands. The proximity sensor using infrared rays may detect an object arranged close to an upper surface of the electronic apparatus 1, and the illumination sensor may detect the brightness of light incident on the upper surface of the electronic apparatus 1. Also, the iris sensor may capture an image of a person's iris arranged over the upper surface of the electronic apparatus 1, and the camera may receive light regarding an object arranged on the upper surface of the electronic apparatus 1.

In order to prevent or reduce degradation of the function of the thin-film transistor TFT arranged in the first display area DA1 by light passing through the transmission area TA, a blocking metal layer BML may be between the substrate 100 and the buffer layer 111. The blocking metal layer BML may not be positioned in the second display area DA2. The blocking metal layer BML may be positioned in the first display area DA1 and may include an opening overlapping the transmission area TA.

The encapsulation layer 300 may cover light-emitting diodes LED. The encapsulation layer 300 may include at least one inorganic layer and at least one organic layer. According to some embodiments, the encapsulation layer 300 may include a first inorganic layer, a second inorganic layer, and an organic layer therebetween.

The input sensing layer 400 may be arranged on the encapsulation layer 300. The input sensing layer 400 may obtain coordinate information according to an external input, for example, a touch event using an object such as a finger or a stylus pen. The input sensing layer 400 may include a touch electrode, and trace lines connected to the touch electrode. The input sensing layer 400 may sense an external input by using a mutual capacitance method or a self-capacitance method.

The anti-reflection layer 600 may reduce the reflectance of light (external light) incident from the outside toward the display panel 10. The anti-reflection layer 600 may include a light-shielding layer 610, a color filter 620, and an overcoat layer 630. The light-shielding layer 610 may include an opening 610OP1 overlapping the light-emitting diode LED of the first display area DA1 and an opening 610OP3 overlapping the light-emitting diode LED of the second display area DA2, and color filters 620 may be arranged in the openings 610OP1 and 610OP3, respectively. The light-shielding layer 610 may include an opening 610OP2 non-overlapping with the light-emitting diode LED. The opening 610OP2 may correspond to the transmission area TA, and a portion of the overcoat layer 630 may be positioned in the opening 610OP2.

The window 700 may be arranged on the anti-reflection layer 600. The window 700 may be coupled to the anti-reflection layer 600 through an adhesive layer such as an optically clear adhesive. The window 700 may include a glass material or a plastic material. The glass material may include ultra-thin glass. The plastic material may include a polymer resin such as polyethersulfone, polyacrylate, polyether imide, polyethylene naphthalate, polyethylene terephthalate, polyphenylene sulfide, polyarylate, polyimide, polycarbonate, or cellulose acetate propionate.

Figure 6:
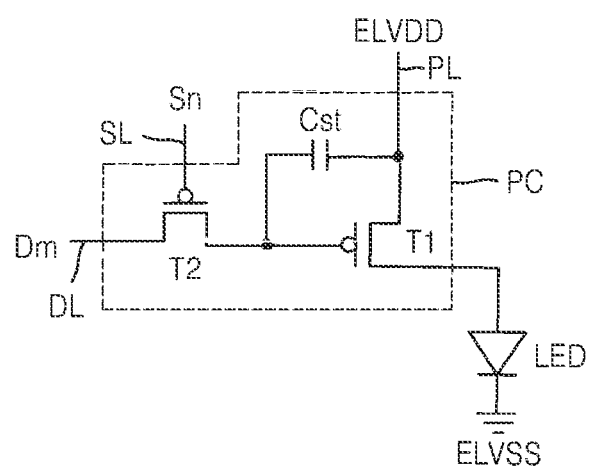
FIG. 6 is a schematic equivalent circuit diagram of a pixel circuit electrically connected to a light-emitting diode of an electronic apparatus, according to some embodiments.

FIG. 6 is a schematic equivalent circuit diagram of a pixel circuit PC electrically connected to a light-emitting diode LED of an electronic apparatus, according to some embodiments.

Referring to FIG. 6, according to some embodiments, the pixel circuit PC may include a first transistor T1, a second transistor T2, and a storage capacitor Cst.

The second transistor T2 is a switching transistor that may be connected to a scan line SL and a data line DL and configured to transmit a data voltage (or a data signal Dm) input from the data line DL to the first transistor T1 based on a switching voltage (or a switching signal Sn) input from the scan line SL. The storage capacitor Cst may be connected to the second transistor T2 and a driving voltage line PL and may be configured to store a voltage corresponding to a difference between a voltage received from the second transistor T2 and a first power voltage ELVDD supplied to the driving voltage line PL.

The first transistor T1 is a driving transistor that may be connected to the driving voltage line PL and the storage capacitor Cst and configured to control a driving current flowing through the light-emitting diode LED from the driving voltage line PL in response to a voltage value stored in the storage capacitor Cst. The light-emitting diode LED may emit light having a certain luminance due to the driving current. An opposite electrode (e.g., a cathode) of the light-emitting diode LED may receive a second power voltage ELVSS.

Though FIG. 6 illustrates that the pixel circuit PC includes two transistors and one storage capacitor, embodiments according to the present disclosure are not limited thereto. The number of transistors and the number of storage capacitors may be variously changed according to the design of the pixel circuit PC. That is, there may be additional transistors, and capacitors, as well as other electrical components in the pixel circuit PC without departing from the spirit and scope of embodiments according to the present disclosure. For example, the pixel circuit PC may include three or more transistors.

Figure 7:
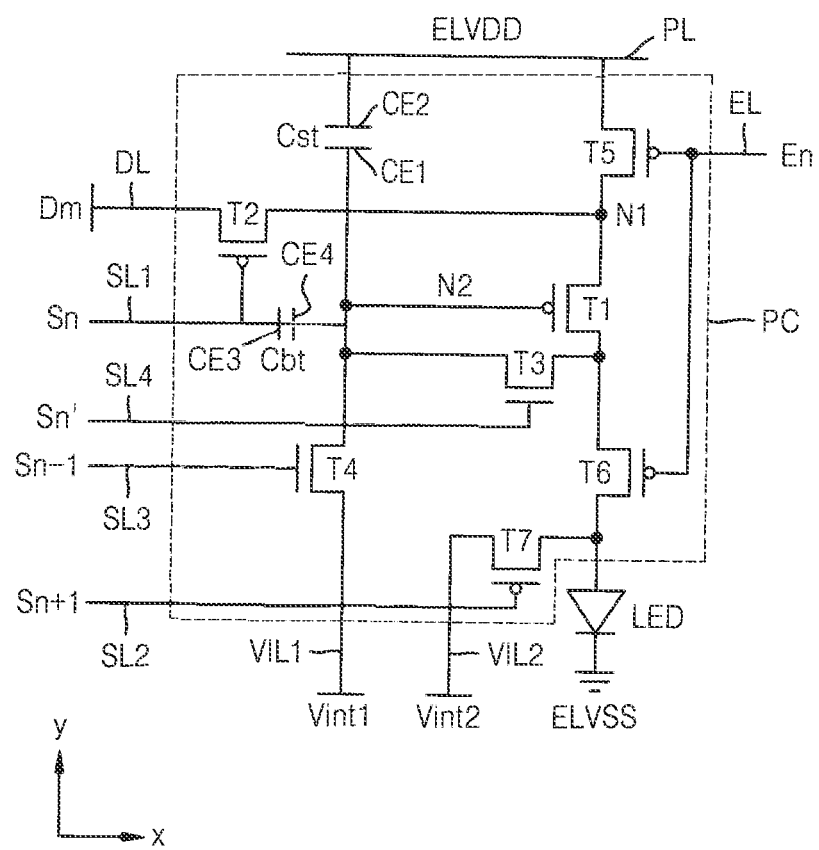
FIG. 7 is a schematic equivalent circuit diagram of a pixel circuit electrically connected to a light-emitting diode of an electronic apparatus, according to some embodiments.

FIG. 7 is a schematic equivalent circuit diagram of the pixel circuit PC electrically connected to the light-emitting diode LED of the electronic apparatus, according to some embodiments.

Referring to FIG. 7, according to some embodiments, the pixel circuit PC may include a first transistor T1, a second transistor T2, a third transistor T3, a fourth transistor T4, a fifth transistor T5, a sixth transistor T6, a seventh transistor T7, a first storage capacitor Cst, and a second storage capacitor Cbt. The first to seventh transistors T1, T2, T3, T4, T5, T6, and T7, the first and second storage capacitors Cst and Cbt may be connected to signal lines, a first initialization voltage line VIL1, a second initialization voltage line VIL2, and the driving voltage line PL. The signal lines may include a data line DL, a first scan line SL1, a second scan line SL2, a third scan line SL3, a fourth scan line SL4, and an emission control line EL. According to some embodiments, at least one of the signal lines, the first and second initialization voltage lines VIL1 or VIL2, and/or the driving voltage line PL may be shared among neighboring pixels.

The driving voltage line PL may be configured to transmit the first power voltage ELVDD to the first transistor T1. The first initialization voltage line VIL1 may be configured to transmit, to the pixel circuit PC, a first initialization voltage Vint1 that initializes the first transistor T1. The second initialization voltage line VIL2 may be configured to transmit, to the pixel circuit PC, a second initialization voltage Vint2 that initializes the light-emitting diode LED.

The first scan line SL1, the second scan line SL2, the third scan line SL3, the fourth scan line SL4, the emission control line EL, the first initialization voltage line VIL1, and the second initialization voltage line VIL2 may extend in an x-direction and may be spaced apart from each other in each row. The data line DL and the driving voltage line PL may extend in a y-direction and may be spaced apart from each other in each column.

Among the first to seventh transistors T1 to T7, the third transistor T3 and the fourth transistor T4 may be implemented by an n-channel metal-oxide-semiconductor field-effect transistor (MOSFET) (NMOS), and the others may be implemented by a p-channel MOSFET (PMOS). However, embodiments according to the present disclosure are not limited thereto.

The first transistor T1 may be electrically connected to the driving voltage line PL via the fifth transistor T5 and may be electrically connected to the light-emitting diode LED via the sixth transistor T6. The first transistor T1 may serve as a driving transistor and may be configured to receive a data signal Dm according to a switching operation of the second transistor T2 and supply the driving current to the light-emitting diode LED.

The second transistor T2 may be connected to the first scan line SL1 and the data line DL and be connected to the driving voltage line PL via the fifth transistor T5. The second transistor T2 may be turned on in response to a first scan signal Sn received through the first scan line SL1 and may be configured to perform a switching operation of transmitting, to a node N1, the data signal Dm transmitted to the data line DL.

The third transistor T3 may be connected to the fourth scan line SL4 and may be connected to the light-emitting diode LED via the sixth transistor T6. The third transistor T3 may be turned on in response to a fourth scan signal Sn' received through the fourth scan line SL4 and may be configured to cause the first transistor T1 to be diode-connected.

The fourth transistor T4 may be connected to the third scan line SL3, which is a previous scan line, and the first initialization voltage line VIL1, and may be turned on in response to a third scan signal Sn−1, which is a previous scan signal and received via the third scan line SL3, to transmit the first initialization voltage Vint1 from the first initialization voltage line VIL1 to a gate electrode of the first transistor T1, thereby initializing a voltage of the gate electrode of the first transistor T1. However, embodiments according to the present disclosure are not limited thereto.

The fifth transistor T5 and the sixth transistor T6 may be connected to the emission control line EL, and may be simultaneously (or concurrently) turned on in response to an emission control signal En received through the emission control line EL to form a current path so that the driving current may flow in a direction from the driving voltage line PL to the light-emitting diode LED.

The seventh transistor T7 may be connected to the second scan line SL2, which is a next scan line, and the second initialization voltage line VIL2, and may be turned on in response to a second scan signal Sn+1, which is a next scan signal and received through the second scan line SL2, to transmit, to the light-emitting diode LED, the second initialization voltage Vint2 from the second initialization voltage line VIL2, thereby initializing the light-emitting diode LED. However, embodiments according to the present disclosure are not limited thereto. For example, the seventh transistor T7 may be omitted.

According to some embodiments, the first storage capacitor Cst may include a first electrode CE1 and a second electrode CE2. According to some embodiments, the first electrode CE1 may be connected to the gate electrode of the first transistor T1, and the second electrode CE2 may be connected to the driving voltage line PL. The first storage capacitor Cst may store and maintain a voltage corresponding to a difference between voltages of both ends of the driving voltage line PL and the gate electrode of the first transistor T1, so that the voltage applied to the gate electrode of the first transistor T1 may be maintained.

The second storage capacitor Cbt may include a third electrode CE3 and a fourth electrode CE4. The third electrode CE3 may be connected to the first scan line SL1 and a gate electrode of the second transistor T2. The fourth electrode CE4 may be connected to the gate electrode of the first transistor T1 and the first electrode CE1 of the first storage capacitor Cst. The second storage capacitor Cbt may be a boosting capacitor, and when the first scan signal Sn of the first scan line SL1 is a voltage turning off the second transistor T2, the second storage capacitor Cbt may increase a voltage of a node N2 to reduce a voltage displaying black (a black voltage).

The light-emitting diode LED may include a pixel electrode (e.g., an anode) and an opposite electrode (e.g., a cathode), and the opposite electrode may receive the second power voltage ELVSS. The light-emitting diode LED may receive the driving current from the first transistor T1 to emit light, thereby displaying an image.

Some example operations of the pixel circuit PC according to some embodiments and a pixel electrically connected to the pixel circuit PC are described in more detail below.

During a first initialization period, when the third scan signal Sn−1 is supplied through the third scan line SL3, the fourth transistor T4 may be turned on in accordance with the third scan signal Sn−1, and the first transistor T1 may be initialized by the first initialization voltage Vint1 supplied from the first initialization voltage line VIL1.

During a data programming period, when the first scan signal Sn and the fourth scan signal Sn' are respectively supplied through the first scan line SL1 and the fourth scan line SL4, the second transistor T2 and the third transistor T3 may be turned on in accordance with the first scan signal Sn and the fourth scan signal Sn'. In this case, the first transistor T1 may be diode-connected by the turned-on third transistor T3 and may be biased in a forward direction. A voltage obtained by compensating for a threshold voltage (Vth) of the first transistor T1 in the data signal Dm supplied from the data line DL may be applied to the gate electrode of the first transistor T1. The first power voltage ELVDD and the compensated voltage may be applied to both ends of the first storage capacitor Cst, and electric charges corresponding to a voltage difference between both ends of the first storage capacitor Cst may be stored in the first storage capacitor Cst.

During an emission period, the fifth transistor T5 and the sixth transistor T6 may be turned on by the emission control signal En supplied from the emission control line EL. The driving current may be generated according to the difference between the voltage of the gate electrode of the first transistor T1 and the first power voltage ELVDD, and the driving current may be supplied to the light-emitting diode LED through the sixth transistor T6.

During a second initialization period, when a second scan signal Sn+1 is supplied through the second scan line SL2, the seventh transistor T7 may be turned on in response to the second scan signal Sn+1, and the light-emitting diode LED may be initialized by the second initialization voltage Vint2 supplied from the second initialization voltage line VIL2.

According to some embodiments, at least one of the plurality of transistors T1 to T7 may include an oxide-containing semiconductor layer, and the others may include a silicon-containing semiconductor layer. For example, the first transistor T1 that directly affects the brightness of the display panel 10 is configured to include a silicon semiconductor including polycrystalline silicon having high reliability, and thus, a high-resolution display panel 10 may be implemented.

Because an oxide semiconductor has high carrier mobility and low leakage current, a voltage drop thereof is not great despite a long driving time. That is, even during low-frequency driving, a color change of the image according to the voltage drop is not great, and thus, low-frequency driving is possible. As the oxide semiconductor has a small leakage current as described above, at least one of the third transistor T3 or the fourth transistor T4, which is connected to the gate electrode of the first transistor T1, may be formed of an oxide semiconductor to prevent or reduce a leakage current that may flow to the gate electrode of the first transistor T1 and also reduce power consumption. However, embodiments according to the present disclosure are not limited thereto. All of the plurality of transistors T1 to T7 may include a silicon-containing semiconductor layer. Also, the transistors other than the third transistor T3 and the fourth transistor T4 may include an oxide-containing semiconductor layer.

Figure 8:
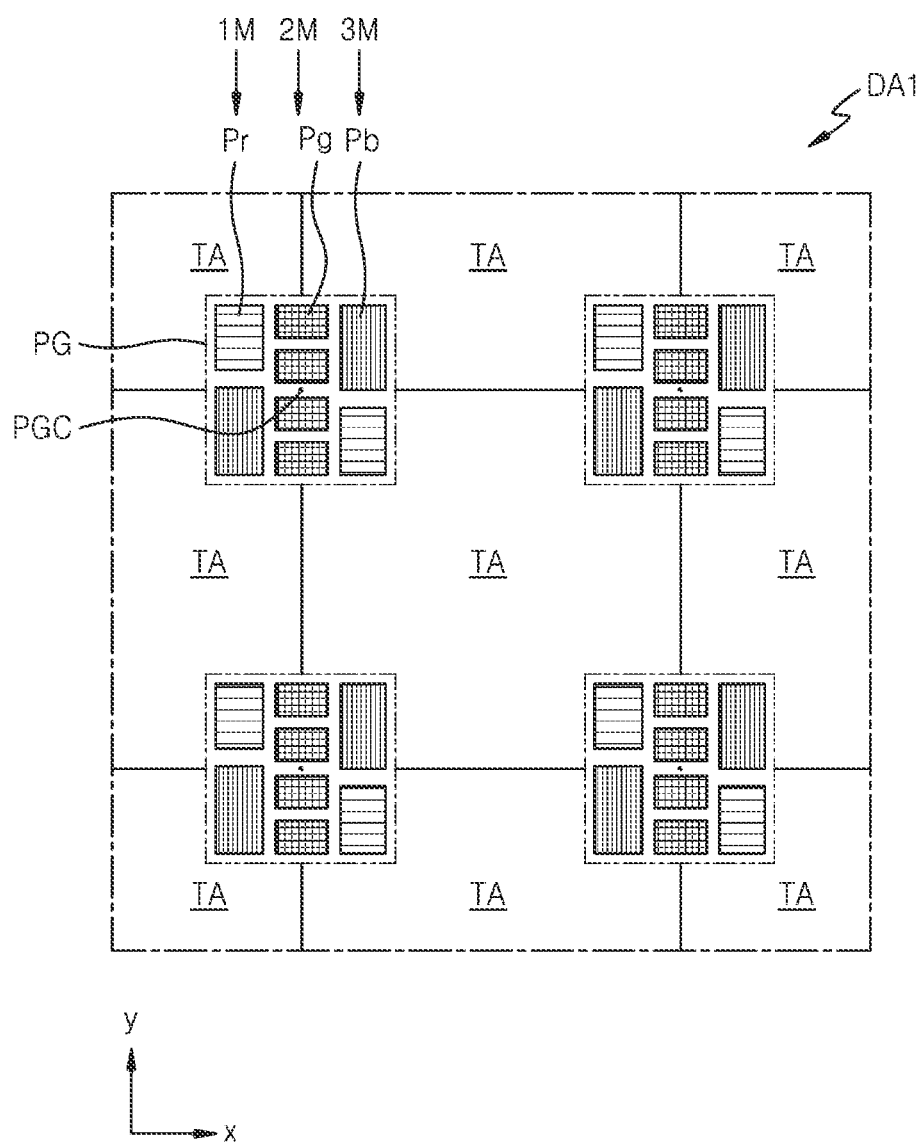
FIG. 8 is a schematic plan view of a portion of a first display area of a display panel, according to some embodiments.
Figure 9:
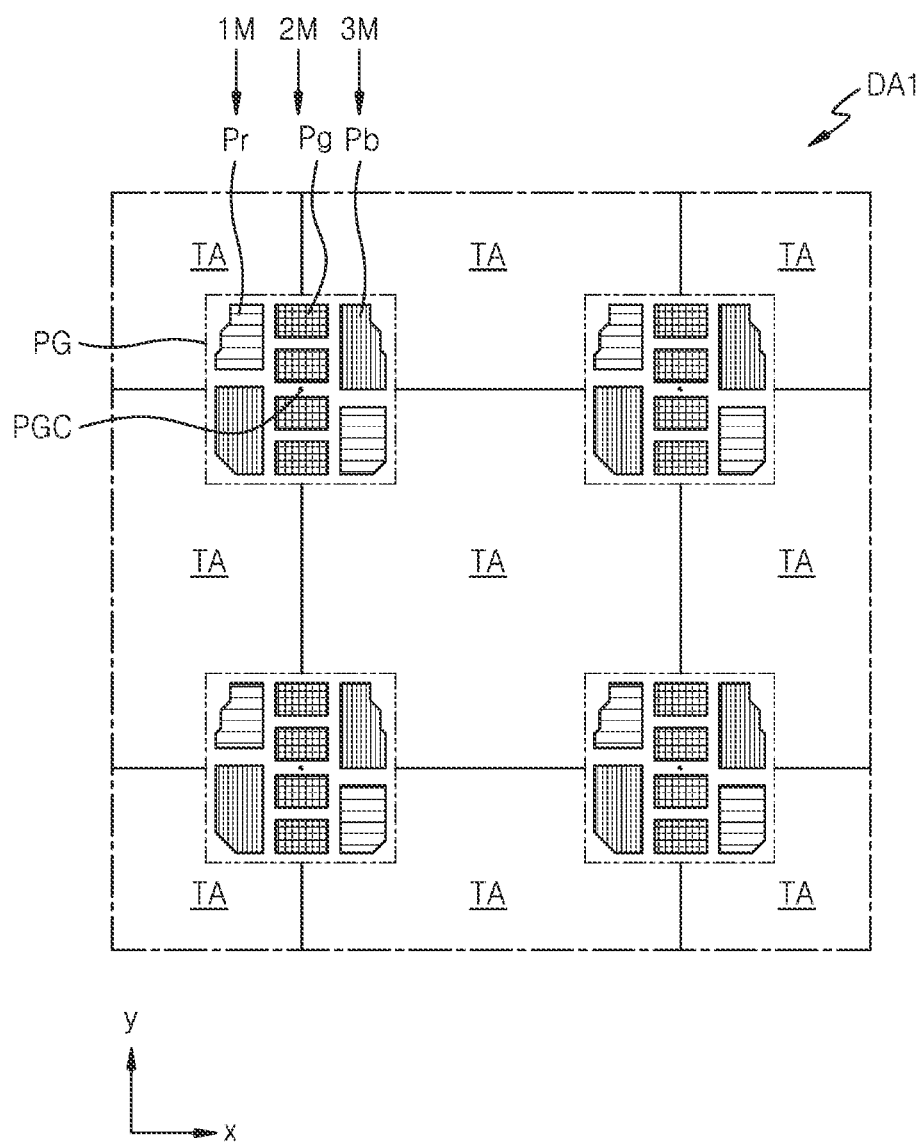
FIG. 9 is a schematic plan view of a portion of a first display area of a display panel, according to some embodiments.

FIG. 8 is a schematic plan view of a portion of a first display area DA1 of a display panel, according to some embodiments, and FIG. 9 is a schematic plan view of a portion of the first display area DA1 of the display panel, according to some embodiments.

Referring to FIG. 8, pixels are arranged in the first display area DA1, and the pixels may include first to third pixels that emit light having different colors. Hereinafter, for convenience of description, it will be described that the first pixel is a red pixel Pr, the second pixel is a green pixel Pg, and the third pixel is a blue pixel Pb.

According to some embodiments, pixel groups PG may be spaced apart from each other in the first display area DA1. Each of the pixel groups PG may be surrounded by transmission areas TA, and may include pixels that emit light having different colors, for example, a red pixel Pr, a green pixel Pg, and a blue pixel Pb. According to some embodiments, each of the pixel groups PG may include two red pixels Pr, four green pixels Pg, and two blue pixels Pb.

The red pixels Pr, the green pixels Pg, and the blue pixels Pb illustrated in FIG. 8 may emit red, green, and blue light by using light-emitting diodes arranged in corresponding pixels, respectively. Accordingly, the arrangement of the pixels may correspond to the arrangement of light-emitting diodes which are display elements. For example, positions of the red pixels Pr illustrated in FIG. 8 may indicate positions of light-emitting diodes that emit red light. Similarly, positions of the green pixels Pg may indicate positions of light-emitting diodes that emit green light, and positions of the blue pixels Pb may indicate positions of light-emitting diodes that emit blue light.

For example, when the pixel groups PG including the red pixels Pr, the green pixels Pg, and the blue pixels Pb are spaced apart from each other, it may indicate that display element groups including that light-emitting diodes that emit red, green, and blue light are spaced apart from each other.

The pixel group PG may be symmetric with respect to a center PGC of the pixel group PG. For example, a red pixel Pr and a blue pixel Pb may be arranged in a first column 1M, and four green pixels Pg may be spaced apart from each other by a certain interval in a second column 2M. Also, a blue pixel Pb and a red pixel Pr may be arranged in a third column 3M. In this case, the red pixel Pr arranged in the first column 1M and the red pixel Pr arranged in the third column 3M may be symmetric with respect to the center PGC of the pixel group PG. The blue pixel Pb arranged in the first column 1M and the blue pixel Pb arranged in the third column 3M may be symmetric with respect to the center PGC of the pixel group PG. The green pixels Pg arranged in the second column 2M may be symmetric with respect to the center PGC of the pixel group PG.

According to some embodiments, a length of the blue pixel Pb in the y-direction may be greater than a length of the red pixel Pr in the y-direction. The length of the blue pixel Pb in the y-direction may be greater than or equal to a sum of lengths of two green pixels Pg in the y-direction. However, embodiments according to the present disclosure are not limited thereto.

Referring to FIG. 8, the red pixels Pr, the green pixels Pg, and the blue pixels Pb may have a substantially rectangular shape on a plane (or in a plan view, e.g., a direction perpendicular, or normal, with respect to a plane parallel to the display surface). For example, the red pixel Pr and the blue pixel Pb may each have a rectangular shape having a short side in the x-direction and a long side in the y-direction. The green pixel Pg may have a rectangular shape having a long side in the x-direction and a short side in the y-direction. However, embodiments according to the present disclosure are not limited thereto.

According to some embodiments, at least one of the red pixel Pr, the green pixel Pg, or the blue pixel Pb may have an n-polygonal shape (n is a natural number of 5 or more). For example, as illustrated in FIG. 9, the green pixel Pg may have a rectangular shape, but the red pixel Pr and the blue pixel Pb may each have edges adjacent to transmission areas TA, which are bent at least once, and thus may have an n-polygonal shape (n is a natural number of 5 or more) on a plane.

Figure 10:
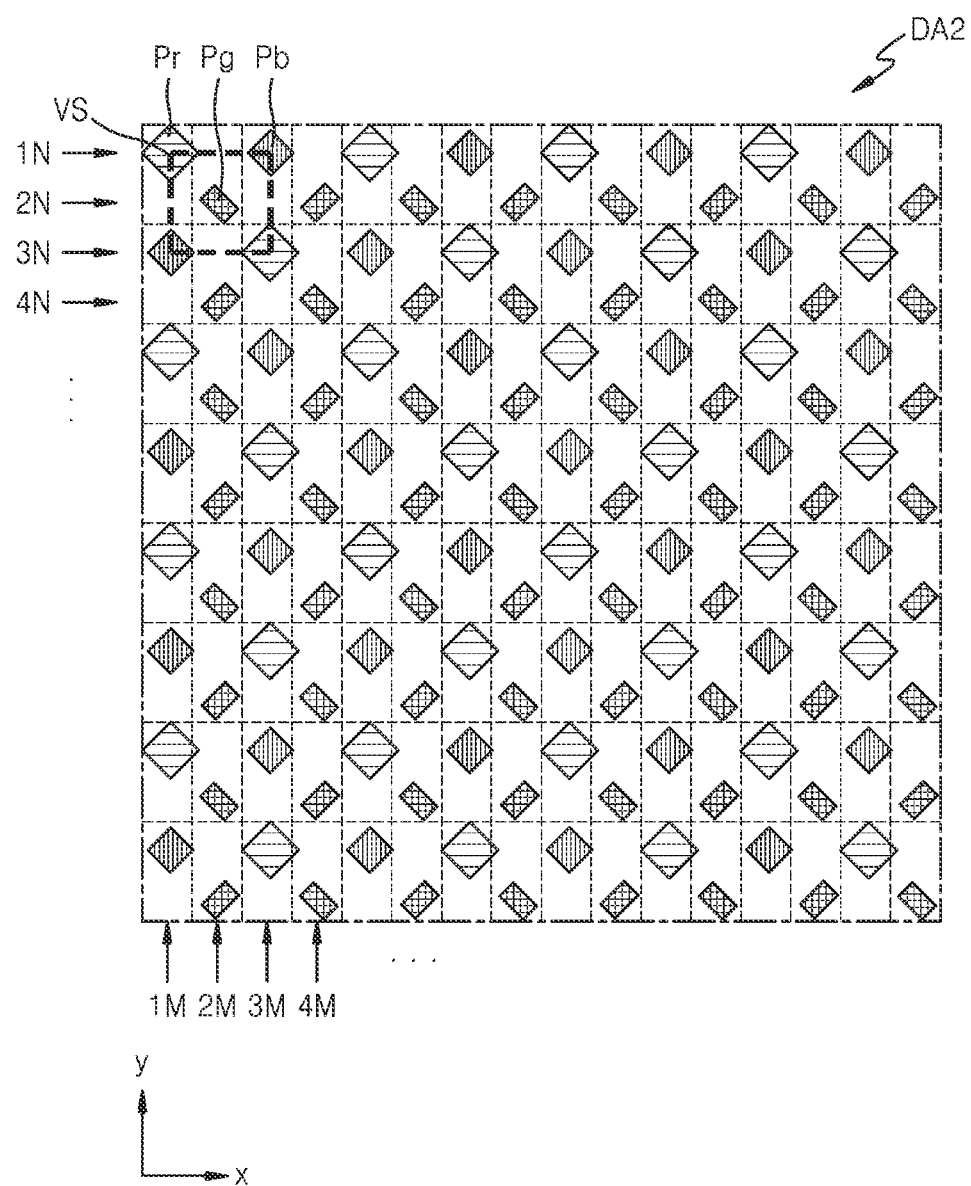
FIG. 10 is a schematic plan view of a portion of a second display area of a display panel, according to some embodiments.

FIG. 10 is a schematic plan view of a portion of a second display area DA2 of the display panel, according to some embodiments.

Referring to FIG. 10, pixels are arranged in the second display area DA2, and the pixels may include first to third pixels that emit light having different colors. Hereinafter, for convenience of description, it will be described that the first pixel is a red pixel Pr, the second pixel is a green pixel Pg, and the third pixel is a blue pixel Pb.

According to some embodiments, the red pixel Pr, the green pixel Pg, and the blue pixel Pb may be arranged in the second display area DA2 according to a certain rule. For example, the red pixel Pr, the green pixel Pg, and the blue pixel Pb may be arranged in a diamond pentile (PenTile™) type as illustrated in FIG. 10. However, embodiments according to the present disclosure are not limited thereto.

For example, a plurality of red pixels Pr and a plurality of blue pixels Pb are alternately arranged in a first row 1N, a plurality of green pixels Pg are spaced apart from each other by a certain interval in a second row 2N adjacent to the first row 1N, a plurality of blue pixels Pb and a plurality of red pixels Pr are alternately arranged in a third row 3N adjacent to the second row 2N, and a plurality of green pixels Pg are spaced apart from each other by a certain interval in a fourth row 4N adjacent to the third row 3N. This arrangement of pixels is repeated up to an N-th row. In this case, sizes (or widths) of the blue pixel Pb and the red pixel Pr may be greater than sizes (or widths) of the green pixels Pg.

The red pixels Pr and the blue pixels Pb arranged in the first row 1N and the green pixels Pg arranged in the second row 2N are alternately arranged. Accordingly, a plurality of red pixels Pr and a plurality of blue pixels Pb are alternately arranged in a first column 1M, a plurality of green pixels Pg are spaced apart from each other by a certain interval in a second column 2M adjacent to the first column 1M, a plurality of blue pixels Pb and a plurality of red pixels Pr are alternately arranged in a third column 3M adjacent to the second column 2M, and a plurality of green pixels Pg are spaced apart from each other by a certain interval in a fourth column 4M adjacent to the third column 3M. This arrangement of pixels is repeated up to an M-th column.

When such a pixel arrangement structure is expressed differently, from among vertices of a virtual quadrangle VS having a center point of the green pixel Pg as a center point of the virtual quadrangle VS, the red pixel Pr is arranged at each of a first vertex and a third vertex facing each other, and the blue pixel Pb is arranged at each of a second vertex and a fourth vertex, which are the remaining vertices. In this case, the virtual quadrangle VS may be variously modified, such as a rectangle, a rhombus, a square, etc.

The pixel arrangement structure may be referred to as PenTile™, and high resolution may be implemented by a small number of pixels by applying a rendering drive that represents colors by sharing adjacent pixels.

According to some embodiments, the red pixel Pr and the blue pixel Pb may be greater than the green pixel Pg. According to some embodiments, the red pixel Pr may be greater than the blue pixel Pb, and the red pixel Pr and the blue pixel Pb may have the same size. According to some embodiments, the blue pixel Pb may be greater than the red pixel Pr. However, embodiments according to the present disclosure are not limited thereto.

The red pixels Pr, the green pixels Pg, and the blue pixels Pb illustrated in FIG. 10 may emit red, green, and blue light by using light-emitting diodes arranged in corresponding pixels, respectively. Accordingly, the arrangement of pixels may correspond to the arrangement of light-emitting diodes which are display elements. For example, positions of the red pixels Pr illustrated in FIG. 10 may indicate positions of light-emitting diodes that emit red light. Similarly, positions of the green pixels Pg may indicate positions of light-emitting diodes that emit green light, and positions of the blue pixels Pb may indicate positions of light-emitting diodes that emit blue light.

Figure 11:
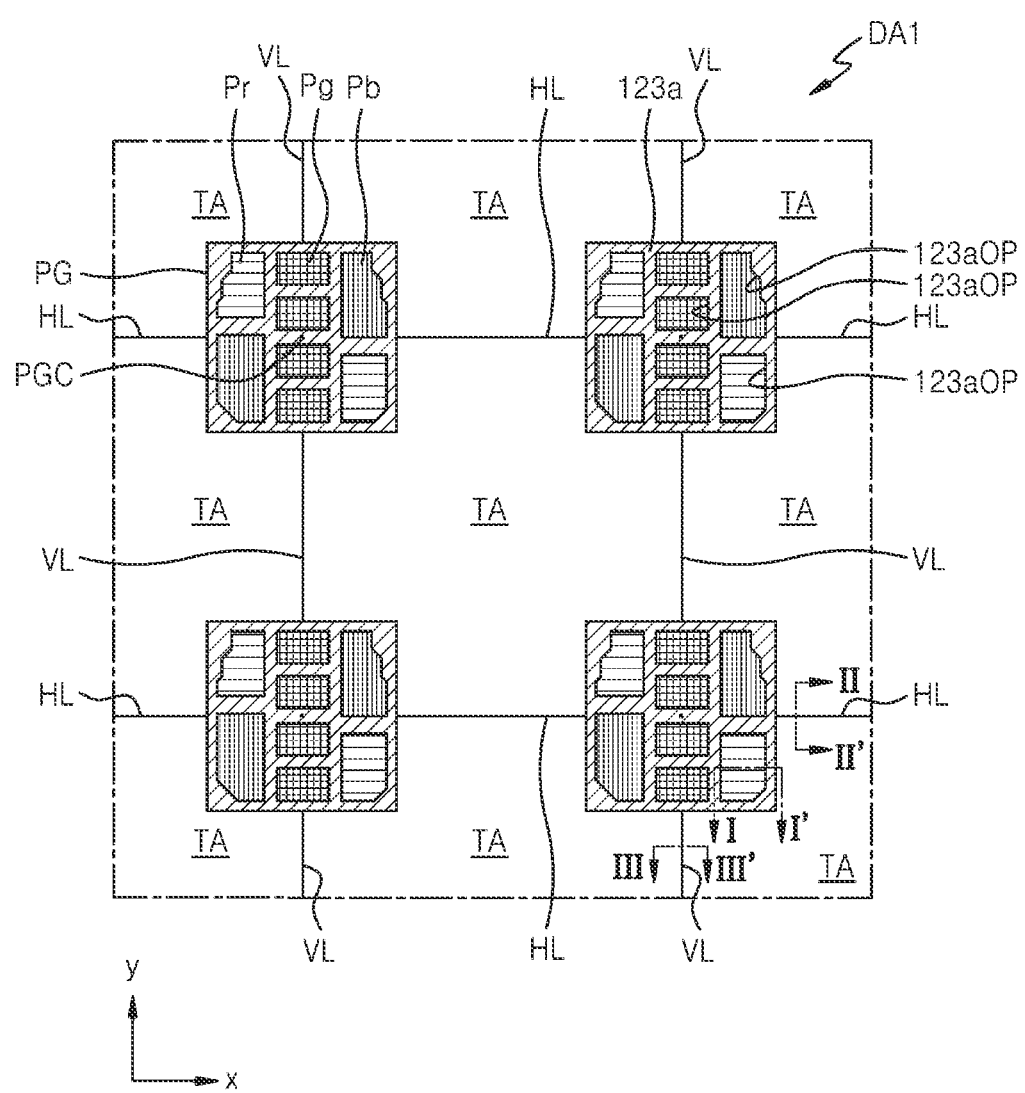
FIG. 11 is a schematic plan view of a first display area of a display panel, according to some embodiments.

FIG. 11 is a schematic plan view of the first display area DA1 of the display panel, according to some embodiments.

Referring to FIG. 11, according to some embodiments, red, green, and blue pixels Pr, Pg, and Pb may be arranged in the first display area DA1.

According to some embodiments, pixel groups PG may be spaced apart from each other in the first display area DA1. Each of the pixel groups PG may be surrounded by transmission areas TA.

According to some embodiments, a first light-shielding insulating layer 123a including a light shielding material may be arranged on the first display area DA1. According to some embodiments, the first light-shielding insulating layer 123a may define an emission area of first light-emitting diodes (e.g., the red pixels Pr, the blue pixels Pb, and the green pixels Pg). That is, each first light-shielding insulating layer 123a may define an emission area of the red pixels Pr, the blue pixels Pb, and the green pixels Pg arranged on the first display area DA1.

According to some embodiments, the first light-shielding insulating layer 123a may have an isolated pattern on a plane. For example, a plurality of first light-shielding insulating layers 123a may be arranged on the first display area DA1, and each of the first light-shielding insulating layers 123a may have an isolated pattern on a plane. For example, the first light-shielding insulating layers 123a may be spaced apart from each other in the x-direction and/or the y-direction. However, embodiments according to the present disclosure are not limited thereto.

According to some embodiments, the first light-shielding insulating layer 123a may include first openings 123aOP corresponding to the pixels, for example, the red pixels Pr, the blue pixels Pb, and the green pixels Pg.

According to some embodiments, signal lines configured to apply an electrical signal to the pixel circuit PC configured to drive the pixels, the first initialization voltage line VIL1 (see FIG. 7), the second initialization voltage line VIL2 (see FIG. 7), and the driving voltage line PL (see FIG. 7) may be arranged on the first display area DA1. In this case, the signal lines may include the data line DL (see FIG. 7), the first scan line SL1 (see FIG. 7), the second scan line SL2 (see FIG. 7), the third scan line SL3 (see FIG. 7), the fourth scan line SL4 (see FIG. 7), and the emission control line EL (see FIG. 7).

According to some embodiments, a first wire (or a horizontal wire HL) and/or a second wire (or a vertical wire VL) may be arranged on the first display area DA1. According to some embodiments, the first wire HL may extend in the x-direction, and the second wire VL may extend in the y-direction.

According to some embodiments, the first wire HL may be at least one of the first scan line SL1, the second scan line SL2, the third scan line SL3, the fourth scan line SL4, the emission control line EL, the first initialization voltage line VIL1, or the second initialization voltage line VIL2, or the second wire VL may be at least one of the data line DL and the driving voltage line PL.

According to some embodiments, in the first display area DA1, at least one of the first wire HL or the second wire VL may be between adjacent (or most adjacent) display element groups (e.g., the pixel groups PG). For example, the first wire HL may be between pixel groups PG spaced apart from each other in the x-direction, and the second wire VL may be between pixel groups PG spaced apart from each other in the y-direction.

According to some embodiments, the first light-shielding insulating layer 123a may not be arranged on at least one of the first wire HL or the second wire VL. For example, the first light-shielding insulating layer 123a may not be arranged on the first wire HL. Also, the first light-shielding insulating layer 123a may not be arranged on the second wire VL. That is, at least one of the first wire HL or the second wire VL may not overlap the first light-shielding insulating layer 123a.

Figure 12:
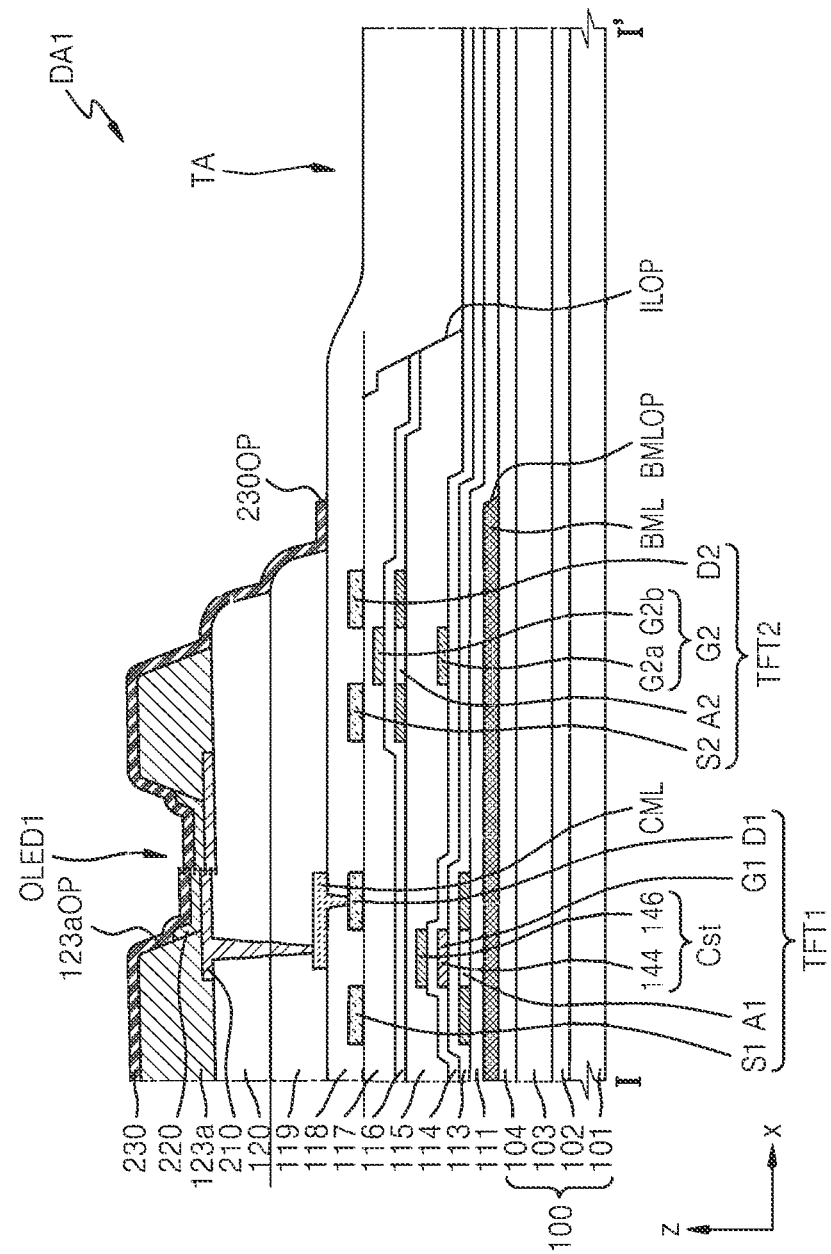
FIG. 12 is a schematic cross-sectional view of a first display area, which is taken along the line I-I' of FIG. 11.

FIG. 12 is a schematic cross-sectional view of the first display area DA1, which is taken along the line I-I' of FIG. 11. FIG. 12 illustrates a case where a light-emitting diode of the display panel includes an organic light-emitting diode. An organic light-emitting diode may be arranged as a light-emitting diode in each of the first display area DA1 and the second display area DA2, and for convenience of description, the organic light-emitting diode arranged in the first display area DA1 may be referred to as a first organic light-emitting diode OLED1, and the organic light-emitting diode arranged in the second display area DA2 may be referred to as a second organic light-emitting diode OLED2.

Referring to FIG. 12, according to some embodiments, the first organic light-emitting diode OLED1 may be arranged on the substrate 100.

The substrate 100 may include a first base layer 101, a first barrier layer 102, a second base layer 103, and a second barrier layer 104. The first base layer 101 and the second base layer 103 may each include a polymer resin, and the first barrier layer 102 and the second barrier layer 104 may each include an inorganic insulating material. The polymer resin may include polyethersulfone, polyacrylate, polyether imide, polyethylene naphthalate, polyethylene terephthalate, polyphenylene sulfide, polyarylate, polyimide, polycarbonate, and/or cellulose acetate propionate.

The buffer layer 111 may be on the substrate 100. The buffer layer 111 may reduce or prevent penetration of foreign materials, moisture, or external air from under the substrate 100. The buffer layer 111 may include an inorganic insulating material such as silicon oxide, silicon oxynitride, or silicon nitride, and may have a single-layered or multi-layered structure including the aforementioned material.

The blocking metal layer BML may be between the substrate 100 and the buffer layer 111 and may be positioned in the first display area DA1. The blocking metal layer BML may prevent or reduce light traveling to the component 20 (see FIG. 5) arranged in the first display area DA1 or light emitted from the component 20 from affecting electronic elements such as first and second thin-film transistors TFT1 and TFT2 of a pixel circuit. The blocking metal layer BML may include a conductive metal such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

The first organic light-emitting diode OLED1 may be electrically connected to the pixel circuit. The first organic light-emitting diode OLED1 may be electrically connected to the pixel circuit between the substrate 100 and the first organic light-emitting diode OLED1.

According to some embodiments, the pixel circuit may include a first thin-film transistor TFT1, a second thin-film transistor TFT2, and a storage capacitor Cst. Here, the first thin-film transistor TFT1 may be one of the first transistor T1 (see FIG. 7), the second transistor T2 (see FIG. 7), the fifth transistor T5 (see FIG. 7), the sixth transistor T6 (see FIG. 7), and the seventh transistor T7 (see FIG. 7) described above with reference to FIG. 7, and the second thin-film transistor TFT2 may be one of the third transistor T3 (see FIG. 7) and the fourth transistor T4 (see FIG. 7), described above with reference to FIG. 7. However, embodiments according to the present disclosure are not limited thereto. The first thin-film transistor TFT1 and the second thin-film transistor TFT2 in FIG. 12 are schematic illustrations of transistors included in the display panel, wherein the first thin-film transistor TFT1 is illustrated as a transistor provided as a semiconductor layer including a silicon semiconductor, and the second thin-film transistor TFT2 is illustrated as a transistor provided as a semiconductor layer including an oxide semiconductor.

The first thin-film transistor TFT may include a first semiconductor layer A1, a first gate electrode G1 overlapping a channel region of the first semiconductor layer A1, and a first source electrode S1 and a first drain electrode D1 at least partially overlapping a source region and a drain region of the first semiconductor layer A1, respectively. A first gate insulating layer 113 may be between the first semiconductor layer A1 and the first gate electrode G1, and a second gate insulating layer 114 may be arranged on the first gate electrode G1.

The second thin-film transistor TFT2 may include a second semiconductor layer A2, a second gate electrode G2 overlapping a channel region of the second semiconductor layer A2, and a second source electrode S2 and a second drain electrode D2 at least partially overlapping a source region and a drain region of the second semiconductor layer A2, respectively. The second gate electrode G2 may include a lower gate electrode G2a arranged under the second semiconductor layer A2 and an upper gate electrode G2b arranged over the second semiconductor layer A2. A first interlayer insulating layer 115 may be arranged on the lower gate electrode G2a, a third gate insulating layer 116 may be between the second semiconductor layer A2 and the upper gate electrode G2b, and a second interlayer insulating layer 117 may be arranged on the upper gate electrode G2b.

The storage capacitor Cst may overlap the first thin-film transistor TFT1. The storage capacitor Cst may include a lower electrode 144 and an upper electrode 146 overlapping each other. According to some embodiments, the first gate electrode G1 of the first thin-film transistor TFT1 may include the lower electrode 144 of the storage capacitor Cst. That is, the first gate electrode G1 of the first thin-film transistor TFT1 may be the lower electrode 144 of the storage capacitor Cst. The second gate insulating layer 114 may be between the lower electrode 144 and the upper electrode 146.

The first semiconductor layer A1 may include a silicon semiconductor. According to some embodiments, the first semiconductor layer A1 may include polysilicon. Alternatively, according to some embodiments, the first semiconductor layer A1 may include amorphous silicon.

The first gate insulating layer 113 may include an inorganic insulating material such as silicon oxide, silicon oxynitride, or silicon nitride, and may have a single-layered or multi-layered structure including the aforementioned material.

The first gate electrode G1 or the lower electrode 144 may include a (low-resistance) conductive material having low resistance, such as Mo, Al, Cu, and/or Ti, and may have a single-layered or multi-layered structure including the aforementioned material.

The second gate insulating layer 114 may include an inorganic insulating material such as silicon oxide, silicon oxynitride, or silicon nitride, and may have a single-layered or multi-layered structure including the aforementioned material.

The upper electrode 146 or the lower gate electrode G2a may include Al, Pt, Pd, Ag, Mg, Au, Ni, Nd, Ir, Cr, Li, Ca, Mo, Ti, W, and/or Cu, and may have a single-layered or multi-layered structure including the aforementioned material.

The first interlayer insulating layer 115 include an inorganic insulating material such as silicon oxide, silicon oxynitride, and silicon nitride, and may have a single-layered or multi-layered structure including the aforementioned material.

According to some embodiments, the second semiconductor layer A2 may include an oxide semiconductor. For example, the second semiconductor layer A2 may include an oxide semiconductor including at least one material selected from the group consisting of indium (In), gallium (Ga), stannum (Sn), zirconium (Zr), vanadium (V), hafnium (Hf), cadmium (Cd), germanium (Ge), Cr, Ti, and zinc (Zn). The second semiconductor layer A2 may include a channel region, and a drain region and a source region doped with impurities. However, embodiments according to the present disclosure are not limited thereto. For example, the second semiconductor layer A2 may be omitted. In this case, all semiconductor layers of a transistor may be formed of a silicon semiconductor.

The third gate insulating layer 116 may be arranged on the second semiconductor layer A2. The third gate insulating layer 116 may include an inorganic insulating material such as silicon oxide, silicon oxynitride, or silicon nitride, and may have a single-layered or multi-layered structure including the aforementioned material. However, embodiments according to the present disclosure are not limited thereto. For example, the third gate insulating layer 116 may be omitted.

The upper gate electrode G2b may be arranged on the third gate insulating layer 116. The upper gate electrode G2b may include Al, Pt, Pd, Ag, Mg, Au, Ni, Nd, Ir, Cr, Li, Ca, Mo, Ti, W, and/or Cu, and may have a single-layered or multi-layered structure including the aforementioned material. However, embodiments according to the present disclosure are not limited thereto. For example, the upper gate electrode G2b may be omitted.

The second interlayer insulating layer 117 may be arranged on the upper gate electrode G2b. The second interlayer insulating layer 117 may include an inorganic insulating material such as silicon oxide, silicon oxynitride, and silicon nitride, and may have a single-layered or multi-layered structure including the aforementioned material. However, embodiments according to the present disclosure are not limited thereto. For example, the second interlayer insulating layer 117 may be omitted.

The first source electrode S1, the first drain electrode D1, the second source electrode S2, and the second drain electrode D2 may be arranged on the second interlayer insulating layer 117. Each of the first source electrode S1, the first drain electrode D1, the second source electrode S2, and the second drain electrode D2 may include Al, Pt, Pd, Ag, Mg, Au, Ni, Nd, Ir, Cr, Li, Ca, Mo, Ti, W, and/or Cu, and may have a single-layered or multi-layered structure including the aforementioned material. For example, the first source electrode S1, the first drain electrode D1, the second source electrode S2, and the second drain electrode D2 may have a three-layered structure of a titanium layer/aluminum layer/titanium layer.

According to some embodiments, the first source electrode S1 and/or the first drain electrode D1 may be electrically connected to the source region and/or the drain region of the first semiconductor layer A1 through contact holes, respectively. Also, the second source electrode S2 and/or the second drain electrode D2 may be electrically connected to the source region and/or the drain region of the second semiconductor layer A2 through contact holes, respectively.

A first organic insulating layer 118, a second organic insulating layer 119, and a third organic insulating layer 120 may be sequentially arranged on the first and second thin-film transistors TFT1 and TFT2. The first and second thin-film transistors TFT1 and TFT2 may be connected to a pixel electrode 210 of a corresponding organic light-emitting diode through a connection electrode layer CML arranged on the first organic insulating layer 118. The connection electrode layer CML may be electrically connected to the first and second thin-film transistors TFT1 and TFT2 through a contact hole defined in the first organic insulating layer 118, and the pixel electrode 210 may be connected to the connection electrode layer CML through a contact hole defined in the second organic insulating layer 119 and the third organic insulating layer 120.

The first organic insulating layer 118, the second organic insulating layer 119, and/or the third organic insulating layer 120 may include an organic insulating material such as acryl, benzocyclobutene (BCB), polyimide, or hexamethyldisiloxane (HMDSO).

According to some embodiments, the third organic insulating layer 120 may be arranged on the second organic insulating layer 119, and thus, the flatness of the display area DA may be improved. However, the third organic insulating layer 120 may be omitted.

According to some embodiments, the connection electrode layer CML, the second organic insulating layer 119, and/or the third organic insulating layer 120 may be omitted, and in this case, the pixel electrode 210 may be directly connected to the first and second thin-film transistors TFT1 and TFT2 through a contact hole defined in the first organic insulating layer 118.

According to some embodiments, the first organic light-emitting diode OLED1 may include the pixel electrode 210, an intermediate layer 220, and an opposite electrode 230. In this case, the pixel electrode 210, the intermediate layer 220, and the opposite electrode 230 may overlap each other.

According to some embodiments, the intermediate layer 220 may include an emission layer. According to some embodiments, the intermediate layer 220 may further include a first functional layer between the pixel electrode 210 and the emission layer and/or a second functional layer between the emission layer and the opposite electrode 230.

The pixel electrode 210 may be arranged on the third organic insulating layer 120. The pixel electrode 210 may include a reflective layer including Ag, Mg, Al, Pt, Pd, Au, Ni, Nd, Ir, Cr, or any compound thereof. The pixel electrode 210 may include a reflective layer including the aforementioned material and a transparent conductive layer over and/or under the reflective layer. The transparent conductive film may include indium tin oxide (ITO), indium zinc oxide (IZO), zinc oxide (ZnO), indium oxide ($In_2O_3$), indium gallium oxide (IGO), aluminum zinc oxide (AZO), or the like. According to some embodiments, the pixel electrode 210 may have a three-layered structure of an ITO layer/Ag layer/ITO layer.

The first light-shielding insulating layer 123*a* may include an opening covering an edge of the pixel electrode 210 and at least partially overlapping the pixel electrode 210. In this regard, FIG. 12 illustrates an opening (hereinafter, referred to as a first opening 123*a*OP) overlapping the pixel electrode 210 of the first organic light-emitting diode OLED1.

The first opening 123*a*OP of the first light-shielding insulating layer 123*a* may define an emission area of the first organic light-emitting diode OLED1. For example, a width of the first opening 123*a*OP of the first light-shielding insulating layer 123*a* may correspond to a width of the emission area of the first organic light-emitting diode OLED1.

The first light-shielding insulating layer 123*a* is a colored insulating layer and may have, for example, a black pigment. For example, the first light-shielding insulating layer 123*a* may include a polyimide (PI)-based binder and a pigment in which red, green, and blue pigments are mixed. Alternatively, the first light-shielding insulating layer 123*a* may include a mixture of a cardo-based binder resin, a lactam-based black pigment, and a blue pigment. Alternatively, the first light-shielding insulating layer 123*a* may include carbon black. The first light-shielding insulating layer 123*a* may prevent or reduce reflection of external light together with the anti-reflection layer 600, which will be described later, and may improve contrast of the display panel.

Figure 13:
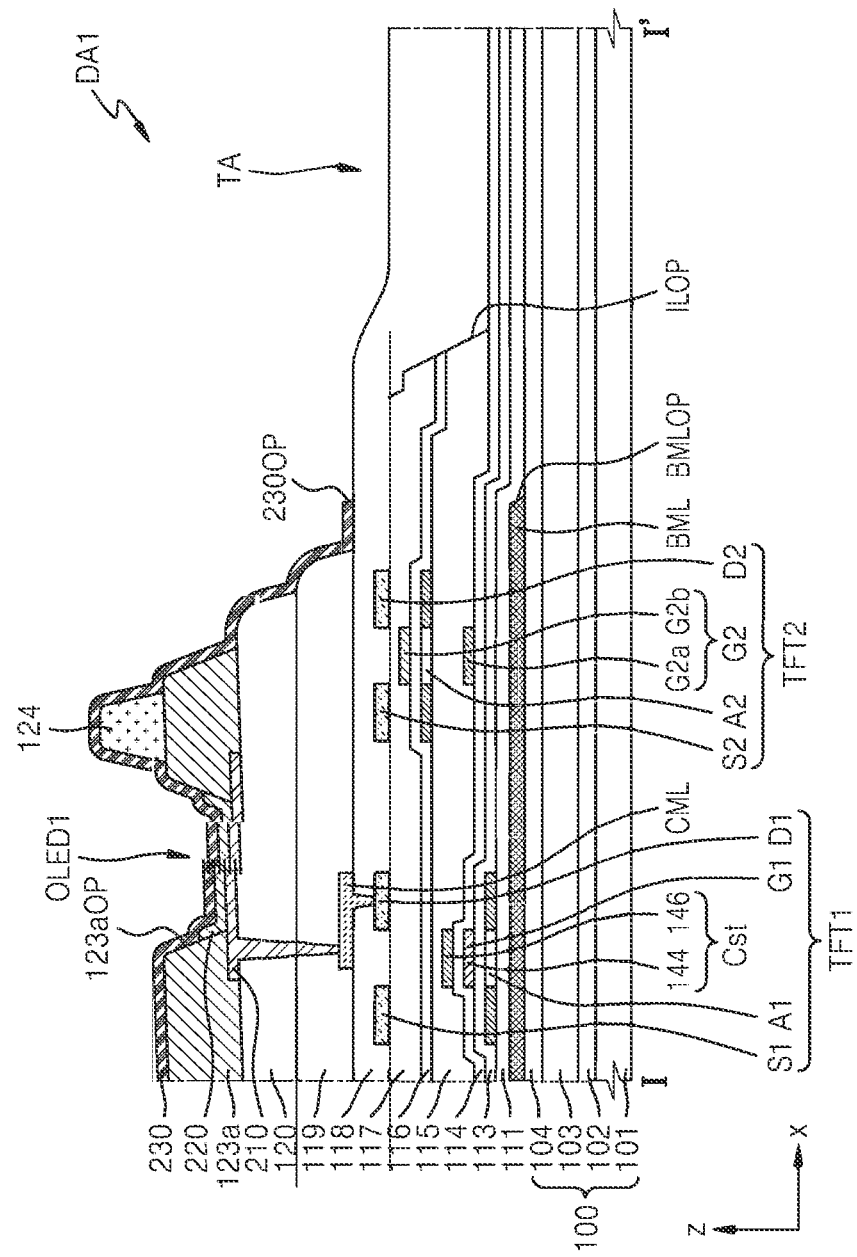
FIG. 13 is a schematic cross-sectional view of a first display area, which is taken along the line I-I' of FIG. 11.

FIG. 13 is a schematic cross-sectional view of the first display area DA1, which is taken along the line I-I' of FIG. 11. For example, the embodiments illustrated with respect to FIG. 13 differ from the embodiments of FIG. 12 in that a spacer 124 is arranged on the first light-shielding insulating layer 123*a*. In FIG. 13, like reference numerals as those in FIG. 12 denote like members, and thus, some repeated description thereof may be omitted.

According to some embodiments, the spacer 124 may be arranged on the first light-shielding insulating layer 123*a*. The spacer 124 may include a material different from that of the first light-shielding insulating layer 123*a*. For example, the first light-shielding insulating layer 123*a* may include a negative photosensitive material, whereas the spacer 124 may include a different material, such as a positive photosensitive material, and the first light-shielding insulating layer 123*a* and the spacer 124 may be formed through separate mask processes.

According to some embodiments, the first light-shielding insulating layer 123*a* may have a dark color, whereas the spacer 124 may have a transparent color compared to the first light-shielding insulating layer 123*a*.

According to some embodiments, the spacer 124 may prevent, reduce, or minimize the first organic light-emitting diode OLED1 from being damaged by a mask.

Referring back to FIG. 12, the intermediate layer 220 may be arranged on the pixel electrode 210. The intermediate layer 220 may be positioned to correspond to the first opening 123*a*OP of the first light-shielding insulating layer 123*a* and may overlap the pixel electrode 210. For example, the emission layer of the intermediate layer 220 may be positioned in the first opening 123*a*OP of the first light-shielding insulating layer 123*a*. The emission layer may include a polymer organic material or a low molecular weight organic material that emits light having a certain color. The first functional layer and the second functional layer may be arranged under and over the emission layer, respectively.

The first functional layer may include a hole transport layer (HTL) and/or a hole injection layer (HIL). The second functional layer may include an electron transport layer (ETL) and/or an electron injection layer (EIL). Unlike the emission layer, the first functional layer and/or the second functional layer may be entirely formed on the substrate 100. In other words, the first functional layer and/or the second functional layer may cover the first display area DA1 and the second display area DA2.

According to some embodiments, the blocking metal layer BML between the substrate 100 and the first and second thin film transistors TFT1 and TFT2 may include an opening BMLOP overlapping the transmission area TA.

Alternatively, some insulating layers (e.g., an inorganic insulating layer) among insulating layers arranged under the pixel electrode 210 may include an opening corresponding to the transmission area TA. For example, a stack of the first interlayer insulating layer 115, the third gate insulating layer 116, and the second interlayer insulating layer 117 may include an inorganic insulating material, and the stack may include an opening ILOP corresponding to the transmission area TA.

According to some embodiments, at least some of the second barrier layer 104, the buffer layer 111, the first gate insulating layer 113, and the second gate insulating layer 114 may be arranged on the transmission area TA. However, embodiments according to the present disclosure are not limited thereto. The second barrier layer 104, the buffer layer 111, the first gate insulating layer 113, and/or the second gate insulating layer 114 may include an opening corresponding to the transmission area TA. That is, the second barrier layer 104, the buffer layer 111, the first gate insulating layer 113, and/or the second gate insulating layer 114 may not be arranged in the transmission area TA.

According to some embodiments, a portion of the first organic insulating layer 118 may be arranged on the transmission area TA. That is, a portion of the first organic insulating layer 118 may be positioned in the aforementioned opening ILOP.

Because the first organic insulating layer 118 is arranged on the transmission area TA, the flowability of monomers constituting an organic layer 320 (see FIG. 19) may be improved, and thus, the flatness of the organic layer 320 formed on the transmission area TA may be improved.

According to some embodiments, the opposite electrode 230 may include an opening 230OP corresponding to the transmission area TA. However, embodiments according to the present disclosure are not limited thereto. The opposite electrode 230 may extend to the transmission area TA, and the opposite electrode 230 may be arranged on the transmission area TA.

According to some embodiments, the first functional layer and/or the second functional layer positioned over/under the emission layer may also be arranged on the transmission area TA. However, embodiments according to the present disclosure are not limited thereto. The first functional layer and/or the second functional layer positioned over/under the emission layer may include an opening corresponding to the transmission area TA.

Figure 14:
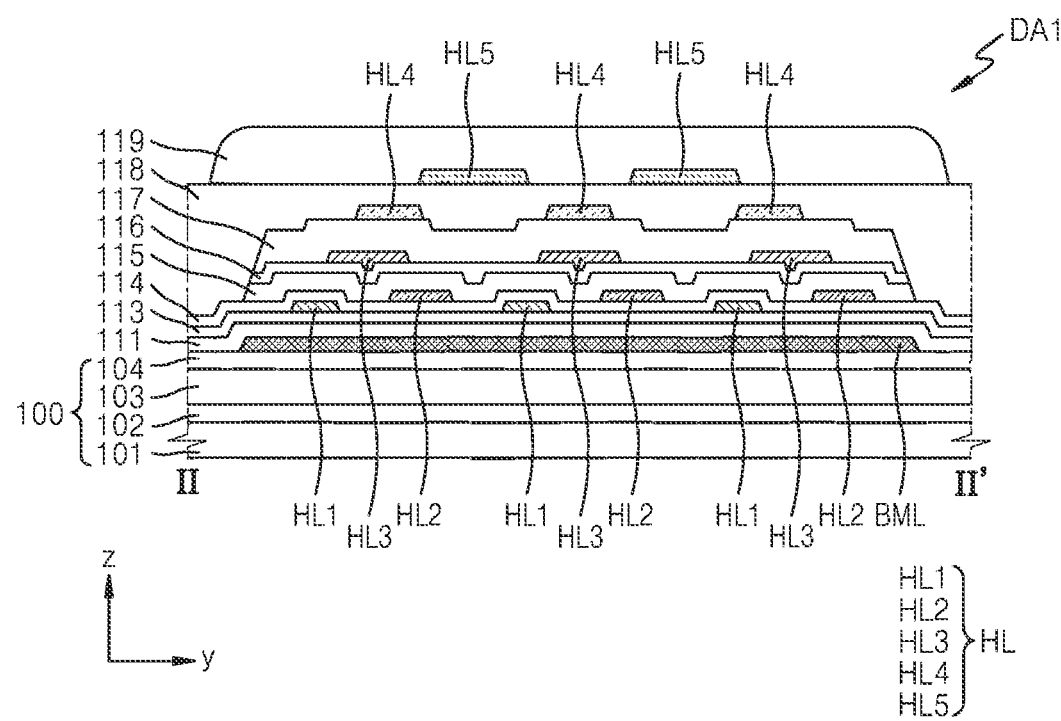
FIG. 14 is a schematic cross-sectional view of a first display area, which is taken along the line II-II' of FIG. 11.

FIG. 14 is a schematic cross-sectional view of the first display area DA1, which is taken along the line II-II' of FIG. 11. For example, FIG. 14 is a diagram for describing the first wire HL of FIG. 12.

Referring to FIG. 14, the first wire HL may include a $(1-1)^{st}$ wire HL1, a $(1-2)^{nd}$ wire HL2, a $(1-3)^{rd}$ wire HL3, a $(1-4)^{th}$ wire HL4, and a $(1-5)^{th}$ wire HL5. According to some embodiments, because the first wire HL extends in the x-direction, the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5 may also extend in the x-direction. However, embodiments according to the present disclosure are not limited thereto.

According to some embodiments, the $(1-1)^{st}$ wire HL1 may be arranged on the first gate insulating layer 113. For example, the $(1-1)^{st}$ wire HL1 and the aforementioned first gate electrode G1 (see FIG. 12) may include the same material and may be arranged on the same layer. However, embodiments according to the present disclosure are not limited thereto.

According to some embodiments, the $(1-2)^{nd}$ wire HL2 may be arranged on the second gate insulating layer 114. For example, the $(1-2)^{nd}$ wire HL2 and the aforementioned upper electrode 146 (see FIG. 12) may include the same material and may be arranged on the same layer. However, embodiments according to the present disclosure are not limited thereto.

According to some embodiments, the $(1-1)^{st}$ wire HL1 and the $(1-2)^{nd}$ wire HL2 may not overlap each other. That is, the $(1-1)^{st}$ wire HL1 and the $(1-2)^{nd}$ wire HL2 may be spaced apart from each other in the y-direction on a plane. However, embodiments according to the present disclosure are not limited thereto. According to some embodiments, the $(1-1)^{st}$ wire HL1 and the $(1-2)^{nd}$ wire HL2 may at least partially overlap each other.

According to some embodiments, the $(1-3)^{rd}$ wire HL3 may be arranged on the third gate insulating layer 116. For example, the $(1-3)^{rd}$ wire HL3 and the aforementioned upper gate electrode G2b (see FIG. 12) may include the same material and may be arranged on the same layer. However, embodiments according to the present disclosure are not limited thereto.

According to some embodiments, the $(1-3)^{rd}$ wire HL3 may at least partially overlap at least one of the $(1-1)^{st}$ wire HL1 or the $(1-2)^{nd}$ wire HL2, which are arranged thereunder. According to some embodiments, the $(1-3)^{rd}$ wire HL3 may be arranged to at least partially overlap the $(1-1)^{st}$ wire HL1 and the $(1-2)^{nd}$ wire HL2.

According to some embodiments, the $(1-4)^{th}$ wire HL4 may be arranged on the second interlayer insulating layer 117. For example, the $(1-4)^{th}$ wire HL4 and the aforementioned first and second source electrodes S1 and S2 (see FIG. 12) and/or first and second drain electrodes D1 and D2 (see FIG. 12) may include the same material and may be arranged on the same layer. However, embodiments according to the present disclosure are not limited thereto.

According to some embodiments, the $(1-4)^{th}$ wire HL4 may at least partially overlap at least one of the $(1-1)^{st}$ wire HL1, the $(1-2)^{nd}$ wire HL2, or the $(1-3)^{rd}$ wire HL3, which are arranged thereunder. According to some embodiments, the $(1-4)^{th}$ wire HL4 may at least partially overlap the $(1-2)^{nd}$ wire HL2 and the $(1-3)^{rd}$ wire HL3. According to some embodiments, the $(1-4)^{th}$ wire HL4 may at least partially overlap the $(1-1)^{st}$ wire HL1.

According to some embodiments, the $(1-5)^{th}$ wire HL5 may be arranged on the first organic insulating layer 118. For example, the $(1-5)^{th}$ wire HL5 and the aforementioned connection electrode layer CML (see FIG. 12) may include the same material and may be arranged on the same layer. However, embodiments according to the present disclosure are not limited thereto.

According to some embodiments, the $(1-5)^{th}$ wire HL5 may at least partially overlap at least one of the $(1-1)^{st}$ wire HL1, the $(1-2)^{nd}$ wire HL2, the $(1-3)^{rd}$ wire HL3, or the $(1-4)^{th}$ wire HL4, which are arranged thereunder. According to some embodiments, the $(1-5)^{th}$ wire HL5 may at least partially overlap the $(1-2)^{nd}$ wire HL2, the $(1-3)^{rd}$ wire HL3, and/or the $(1-4)^{th}$ wire HL4. However, embodiments according to the present disclosure are not limited thereto. According to some embodiments, the $(1-5)^{th}$ wire HL5 may at least partially overlap the $(1-1)^{st}$ wire HL1.

According to some embodiments, the second organic insulating layer 119 may be arranged on the $(1-5)^{th}$ wire HL5. That is, the second organic insulating layer 119 may be provided to cover the $(1-5)^{th}$ wire HL5.

According to some embodiments, some of the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5 are arranged to overlap each other, thereby increasing a size of the transmission area TA and improving light transmittance of the first display area DA1 including the transmission area TA.

According to some embodiments, the blocking metal layer BML may be arranged on the substrate 100. According to some embodiments, the $(1-1)^{st}$ wire HL1, the $(1-2)^{nd}$ wire HL2, the $(1-3)^{rd}$ wire HL3, $(1-4)^{th}$ wire HL4, and the $(1-5)^{th}$ wire HL5 may at least partially overlap the blocking metal layer BML. For example, the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5 may completely overlap the blocking metal layer BML.

According to some embodiments, the first wire HL may be at least one of the first scan line SL1 (see FIG. 7), the second scan line SL2 (see FIG. 7), the third scan line SL3 (see FIG. 7), the fourth scan line SL4 (see FIG. 7), the emission control line EL (see FIG. 7), the first initialization voltage line VIL1 (see FIG. 7), or the second initialization voltage line VIL2 (see FIG. 7). That is, the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5 may be at least one of the aforementioned first scan line SL1, second scan line SL2, third scan line SL3, fourth scan line SL4, emission control line EL, first initialization voltage line VIL1, or second initialization voltage line VIL2, respectively. However, embodiments according to the present disclosure are not limited thereto.

Referring to FIGS. 11, 12, and 14, the first light-shielding insulating layer 123a may not be arranged on the first wire HL. That is, the first wire HL may not overlap the first light-shielding insulating layer 123a. For example, the first light-shielding insulating layer 123a may not be arranged on the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5, and thus, the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5 may not overlap the first light-shielding insulating layer 123a. However, embodiments according to the present disclosure are not limited thereto.

Figure 15:
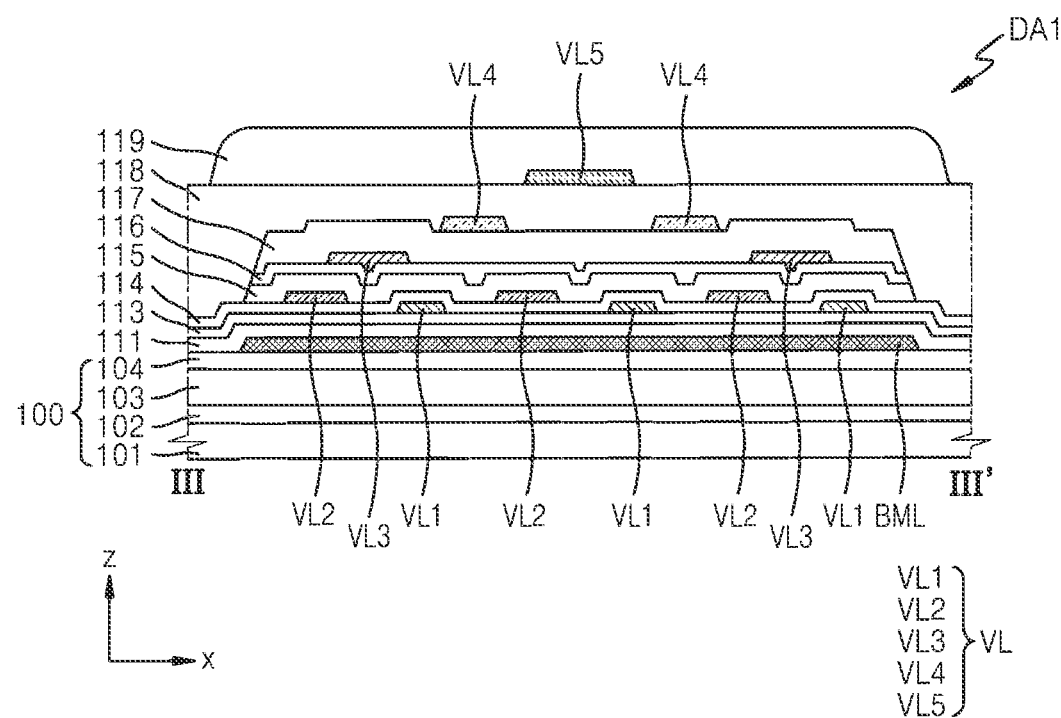
FIG. 15 is a schematic cross-sectional view of a first display area, which is taken along the line III-III' of FIG. 11.

FIG. 15 is a schematic cross-sectional view of the first display area DA1, which is taken along the line III-III' of FIG. 11. For example, FIG. 15 is a diagram for describing the second wire VL of FIG. 12.

Referring to FIG. 15, the second wire VL may include a $(2-1)^{st}$ wire VL1, a $(2-2)^{nd}$ wire VL2, a $(2-3)^{rd}$ wire VL3, a $(2-4)^{th}$ wire VL4, and a $(2-5)^{th}$ wire VL5. According to some embodiments, because the second wire VL extends in the y-direction, the $(2-1)^{st}$ wire VL1, the $(2-2)^{nd}$ wire VL2, the $(2-3)^{rd}$ wire VL3, the $(2-4)^{th}$ wire VL4, and the $(2-5)^{th}$ wire VL5 may also extend in the y-direction. However, embodiments according to the present disclosure are not limited thereto.

According to some embodiments, the $(2-1)^{st}$ wire VL1 may be arranged on the first gate insulating layer 113. For example, the $(2-1)^{st}$ wire VL1 and the aforementioned $(1-1)^{st}$ wire HL1 (see FIG. 14) may include the same material and may be arranged on the same layer.

According to some embodiments, the $(2-2)^{nd}$ wire VL2 may be arranged on the second gate insulating layer 114. For example, the $(2-2)^{nd}$ wire VL2 and the aforementioned $(1-2)^{nd}$ wire HL2 (see FIG. 14) may include the same material and may be arranged on the same layer.

According to some embodiments, the $(2-1)^{st}$ wire VL1 and the $(2-2)^{nd}$ wire VL2 may not overlap each other. That is, the $(2-1)^{st}$ wire VL1 and the $(2-2)^{nd}$ wire VL2 may be spaced apart from each other in the x-direction on a plane. However, embodiments according to the present disclosure are not limited thereto. According to some embodiments, the $(2-1)^{st}$ wire VL1 and the $(2-2)^{nd}$ wire VL2 may at least partially overlap each other.

According to some embodiments, the $(2-3)^{rd}$ wire VL3 may be arranged on the third gate insulating layer 116. For example, the $(2-3)^{rd}$ wire VL3 and the aforementioned $(1-3)^{rd}$ wire HL3 (see FIG. 14) may include the same material and may be arranged on the same layer. However, embodiments according to the present disclosure are not limited thereto.

According to some embodiments, the $(2-3)^{rd}$ wire VL3 may at least partially overlap at least one of the $(2-1)^{st}$ wire VL1 or the $(2-2)^{nd}$ wire VL2, which are arranged thereunder. According to some embodiments, the $(2-3)^{rd}$ wire VL3 may be arranged to at least partially overlap the $(2-1)^{st}$ wire VL1 and the $(2-2)^{nd}$ wire VL2.

According to some embodiments, the $(2-4)^{th}$ wire VL4 may be arranged on the second interlayer insulating layer 117. For example, the $(2-4)^{th}$ wire VL4 and the aforementioned $(1-4)^{th}$ wire HL4 (see FIG. 14) may include the same material and may be arranged on the same layer. However, embodiments according to the present disclosure are not limited thereto.

According to some embodiments, the $(2-4)^{th}$ wire VL4 may partially overlap one of the $(2-1)^{st}$ wire VL1, the $(2-2)^{nd}$ wire VL2, and the $(2-3)^{rd}$ wire VL3, which are arranged thereunder. According to some embodiments, the $(2-4)^{th}$ wire VL4 may at least partially overlap the $(2-1)^{st}$ wire VL1 and the $(2-2)^{nd}$ wire VL2. According to some embodiments, the $(2-4)^{th}$ wire VL4 and the $(2-3)^{rd}$ wire VL3 may at least partially overlap each other.

According to some embodiments, the $(2-5)^{th}$ wire VL5 may be arranged on the first organic insulating layer 118. For example, the $(2-5)^{th}$ wire VL5 and the aforementioned $(1-5)^{th}$ wire HL5 (see FIG. 14) may include the same material and may be arranged on the same layer. However, embodiments according to the present disclosure are not limited thereto.

According to some embodiments, the $(2-5)^{th}$ wire VL5 may at least partially overlap at least one of the $(2-1)^{st}$ wire VL1, the $(2-2)^{nd}$ wire VL2, the $(2-3)^{rd}$ wire VL3, or the $(2-4)^{th}$ wire VL4, which are arranged thereunder. According to some embodiments, the $(2-5)^{th}$ wire VL5 may at least partially overlap the $(2-1)^{st}$ wire VL1 and the $(2-2)^{nd}$ wire VL2. However, embodiments according to the present disclosure are not limited thereto. According to some embodiments, the $(2-5)^{th}$ wire VL5 and the $(2-3)^{rd}$ wire VL3 may at least partially overlap each other.

According to some embodiments, the second organic insulating layer 119 may be arranged on the $(2-5)^{th}$ wire VL5. That is, the second organic insulating layer 119 may be provided to cover the $(2-5)^{th}$ wire VL5.

According to some embodiments, some of the $(2-1)^{st}$ wire VL1, the $(2-2)^{nd}$ wire VL2, the $(2-3)^{rd}$ wire VL3, the $(2-4)^{th}$ wire VL4, and the $(2-5)^{th}$ wire VL5 are arranged to overlap each other, thereby increasing a size of the transmission area TA and improving light transmittance of the first display area DA1 including the transmission area TA.

According to some embodiments, the blocking metal layer BML may be arranged on the substrate 100. According to some embodiments, the $(2-1)^{st}$ wire VL1, the $(2-2)^{nd}$ wire VL2, the $(2-3)^{rd}$ wire VL3, the $(2-4)^{th}$ wire VL4, and the $(2-5)^{th}$ wire VL5 may at least partially overlap the blocking metal layer BML. For example, the $(2-1)^{st}$ wire VL1, the (2-2)$^{nd}$ wire VL2, the (2-3)$^{rd}$ wire VL3, the (2-4)$^{th}$ wire VL4, and the (2-5)$^{th}$ wire VL5 may completely overlap the blocking metal layer BML.

According to some embodiments, the second wire VL may be at least one of the aforementioned data line DL (see FIG. 7) or driving voltage line PL (see FIG. 7). For example, the (2-1)$^{st}$ wire VL1, the (2-2)$^{nd}$ wire VL2, the (2-3)$^{rd}$ wire VL3, the (2-4)$^{th}$ wire VL4, and the (2-5)$^{th}$ wire VL5 may each be at least one of the aforementioned data line DL or driving voltage line PL. However, embodiments according to the present disclosure are not limited thereto.

Referring to FIGS. 11, 12, and 15, the first light-shielding insulating layer 123a may not be arranged on the second wire VL. That is, the second wire VL may not overlap the first light-shielding insulating layer 123a. For example, the first light-shielding insulating layer 123a may not be arranged on the (2-1)$^{st}$ wire VL1, the (2-2)$^{nd}$ wire VL2, the (2-3)$^{rd}$ wire VL3, the (2-4)$^{th}$ wire VL4, and the (2-5)$^{th}$ wire VL5, and thus, the (2-1)$^{st}$ wire VL1, the (2-2)$^{nd}$ wire VL2, the (2-3)$^{rd}$ wire VL3, the (2-4)$^{th}$ wire VL4, and the (2-5)$^{th}$ wire VL5 may not overlap the first light-shielding insulating layer 123a. However, embodiments according to the present disclosure are not limited thereto.

Figure 16:
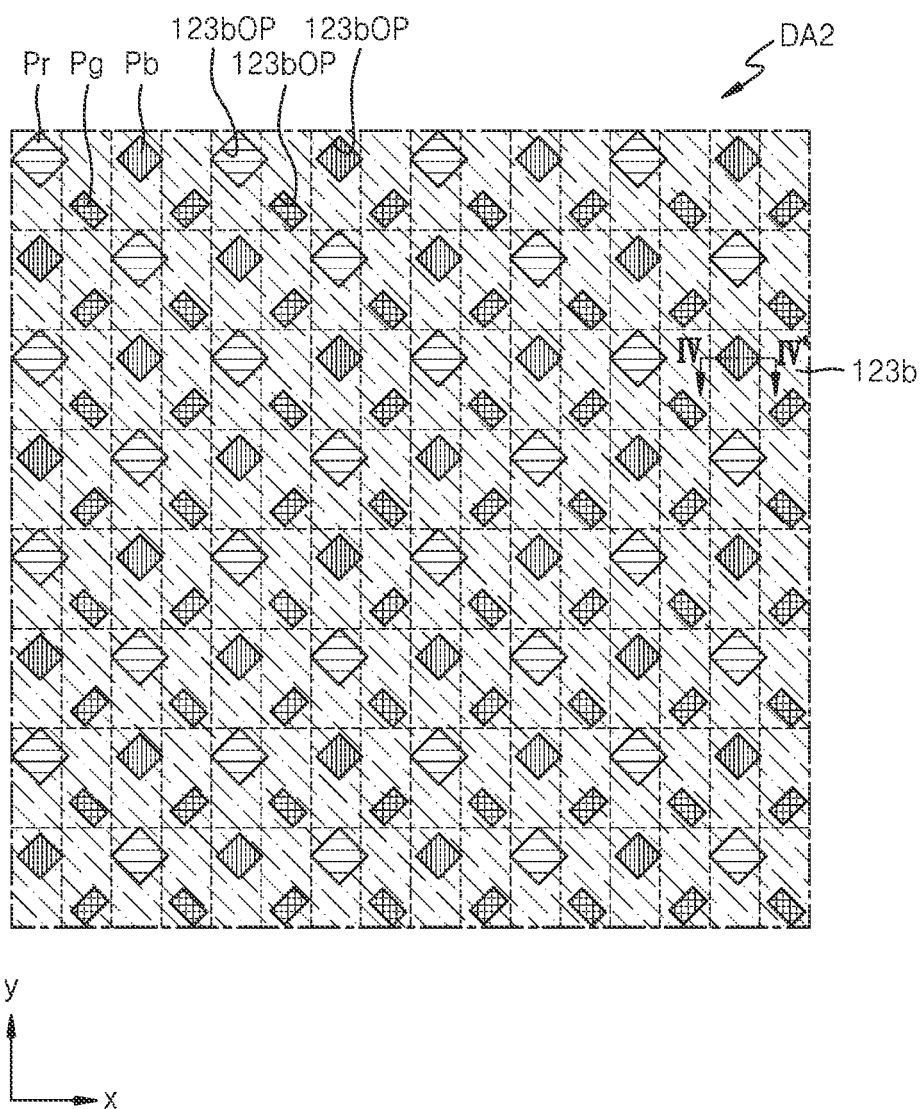
FIG. 16 is a schematic plan view of a portion of a second display area of a display panel, according to some embodiments.

FIG. 16 is a schematic plan view of a portion of the second display area DA2 of the display panel, according to some embodiments.

Referring to FIG. 16, pixels are arranged in the second display area DA2, and the pixels may include first to third pixels that emit light having different colors. Hereinafter, for convenience of description, it will be described that the first pixel is a red pixel Pr, the second pixel is a green pixel Pg, and the third pixel is a blue pixel Pb.

According to some embodiments, a second light-shielding insulating layer 123b including a light shielding material may be arranged on the second display area DA2. According to some embodiments, the second light-shielding insulating layer 123b may define an emission area of second light-emitting diodes (e.g., the red pixels Pr, the blue pixels Pb, and the green pixels Pg). That is, the second light-shielding insulating layer 123b may define an emission area of the red pixels Pr, the blue pixels Pb, and the green pixels Pg arranged on the second display area DA2.

According to some embodiments, the second light-shielding insulating layer 123b may include openings (e.g., fourth openings 123bOP) corresponding to the pixels, for example, the red pixels Pr, the blue pixels Pb, and the green pixels Pg.

Figure 17:
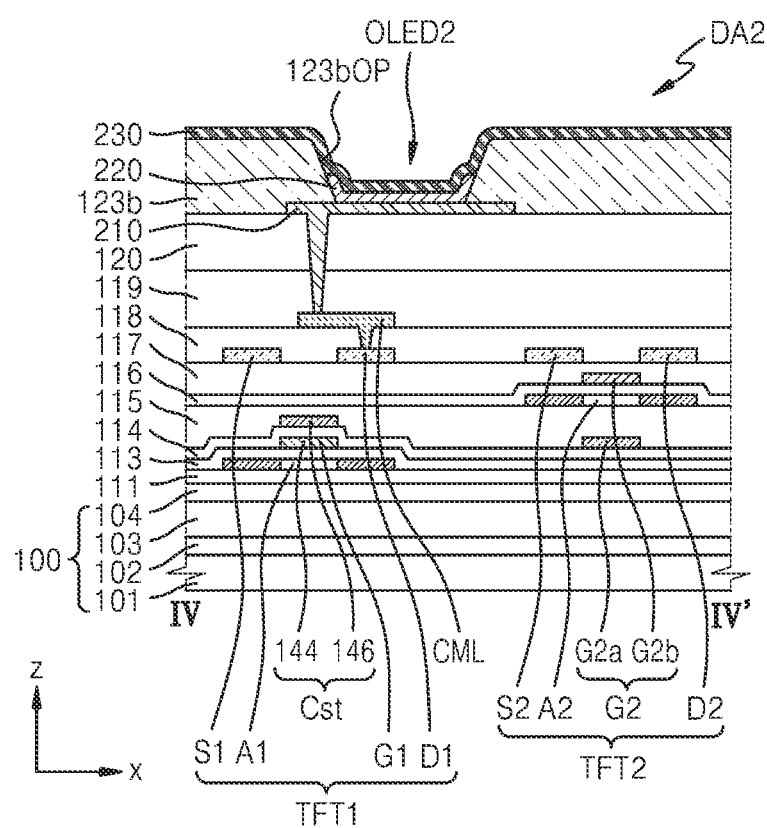
FIG. 17 is a schematic cross-sectional view of a second display area, which is taken along the line IV-IV' of FIG. 16.

FIG. 17 is a schematic cross-sectional view of the second display area DA2, which is taken along the line IV-IV' of FIG. 16. In FIG. 17, like reference numerals as those in FIG. 12 denote like members, and thus, some repeated description thereof may be omitted.

Referring to FIG. 17, according to some embodiments, the second organic light-emitting diode OLED2 may be arranged on the substrate 100.

The substrate 100 may include the first base layer 101, the first barrier layer 102, the second base layer 103, and the second barrier layer 104, and the buffer layer 111 may be arranged on the substrate 100, and the first semiconductor layer A1 may be arranged on the buffer layer 111. The first semiconductor layer A1 may include a silicon semiconductor.

The first gate insulating layer 113 may be arranged on the first semiconductor layer A1, and the first gate electrode G1 may be arranged on the first gate insulating layer 113. The second gate insulating layer 114 may be arranged on the first gate electrode G1, and the upper electrode 146 and the lower gate electrode G2a may be arranged on the second gate insulating layer 114.

The first interlayer insulating layer 115 may be arranged on the upper electrode 146 and the lower gate electrode G2a, and the second semiconductor layer A2 may be arranged on the first interlayer insulating layer 115. According to some embodiments, the second semiconductor layer A2 may include an oxide semiconductor.

The third gate insulating layer 116 may be arranged on the second semiconductor layer A2, and the upper gate electrode G2b may be arranged on the third gate insulating layer 116. Also, the second interlayer insulating layer 117 may be arranged on the upper gate electrode G2b. However, embodiments according to the present disclosure are not limited thereto. At least one of the second semiconductor layer A2, the third gate insulating layer 116, the upper gate electrode G2b, or the second interlayer insulating layer 117 may be omitted.

The source electrodes S1 and S2 and/or the drain electrodes D1 and D2 may be arranged on the second interlayer insulating layer 117, and the first organic insulating layer 118, the second organic insulating layer 119, and the third organic insulating layer 120 may be sequentially arranged on the source electrodes S1 and S2 and/or the drain electrodes D1 and D2. Also, according to some embodiments, the connection electrode layer CML may be arranged on the first organic insulating layer 118. However, embodiments according to the present disclosure are not limited thereto. At least one of the second organic insulating layer 119 or the third organic insulating layer 120 may also be omitted.

According to some embodiments, the second organic light-emitting diode OLED2 may include a pixel electrode 210, an intermediate layer 220, and an opposite electrode 230. In this case, the pixel electrode 210, the intermediate layer 220, and the opposite electrode 230 may overlap each other.

The second light-shielding insulating layer 123b may include an opening covering an edge of the pixel electrode 210 and at least partially overlapping the pixel electrode 210. In this regard, FIG. 17 illustrates an opening (hereinafter, referred to as a fourth opening 123bOP) overlapping the pixel electrode 210 of the second organic light-emitting diode OLED2.

The fourth opening 123bOP of the second light-shielding insulating layer 123b may define an emission area of the second organic light-emitting diode OLED2. For example, a width of the fourth opening 123bOP of the second light-shielding insulating layer 123b may correspond to a width of the emission area of the second organic light-emitting diode OLED2.

The second light-shielding insulating layer 123b is a colored insulating layer and may have, for example, a black pigment. According to some embodiments, the second light-shielding insulating layer 123b and the first light-shielding insulating layer 123a may include the same material.

Figure 18:
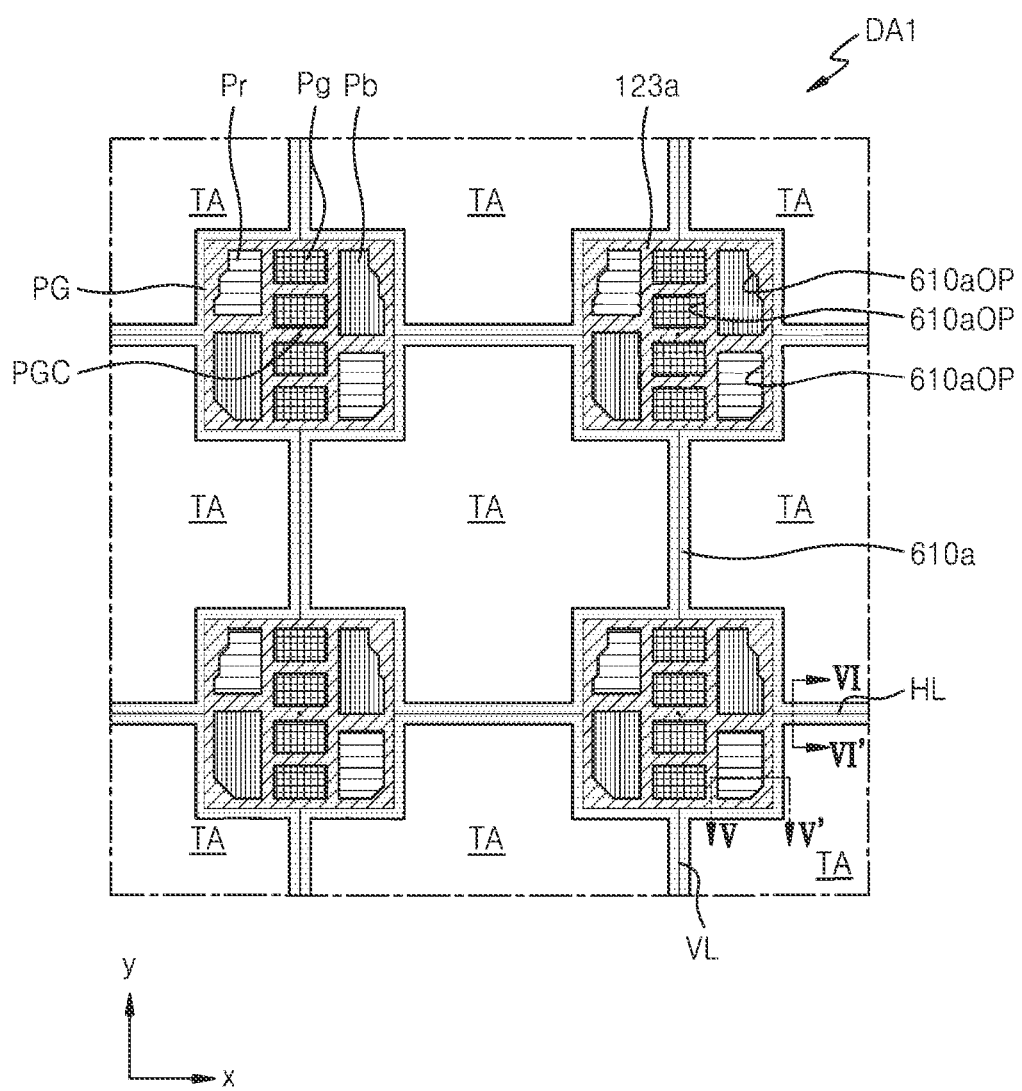
FIG. 18 is a schematic plan view of a first display area of a display panel, according to some embodiments.

FIG. 18 is a schematic plan view of the first display area DA1 of the display panel, according to some embodiments. In FIG. 18, like reference numerals as those in FIG. 11 denote like members, and thus, some repeated description thereof may be omitted.

Referring to FIG. 18, according to some embodiments, a first light-shielding layer 610a including a light shielding material may be arranged on the first display area DA1. According to some embodiments, transmission areas TA may be defined by an edge of the first light-shielding layer 610a. However, embodiments according to the present disclosure are not limited thereto.

According to some embodiments, the first light-shielding layer 610a may include second openings 610aOP corresponding to the pixels, for example, the red pixels Pr, the blue pixels Pb, and the green pixels Pg. Also, the first light-shielding layer 610a may include third openings 610aOP2 (see FIG. 19) corresponding to the transmission area TA.

According to some embodiments, the first light-shielding layer 610a may be arranged on the first wire HL and/or the second wire VL. According to some embodiments, the first light-shielding layer 610a may at least partially overlap the first wire HL and/or the second wire VL. For example, the first light-shielding layer 610a may completely overlap the first wire HL and/or the second wire VL. That is, the first light-shielding layer 610a may completely cover the first wire HL and/or the second wire VL on a plane.

Figure 19:
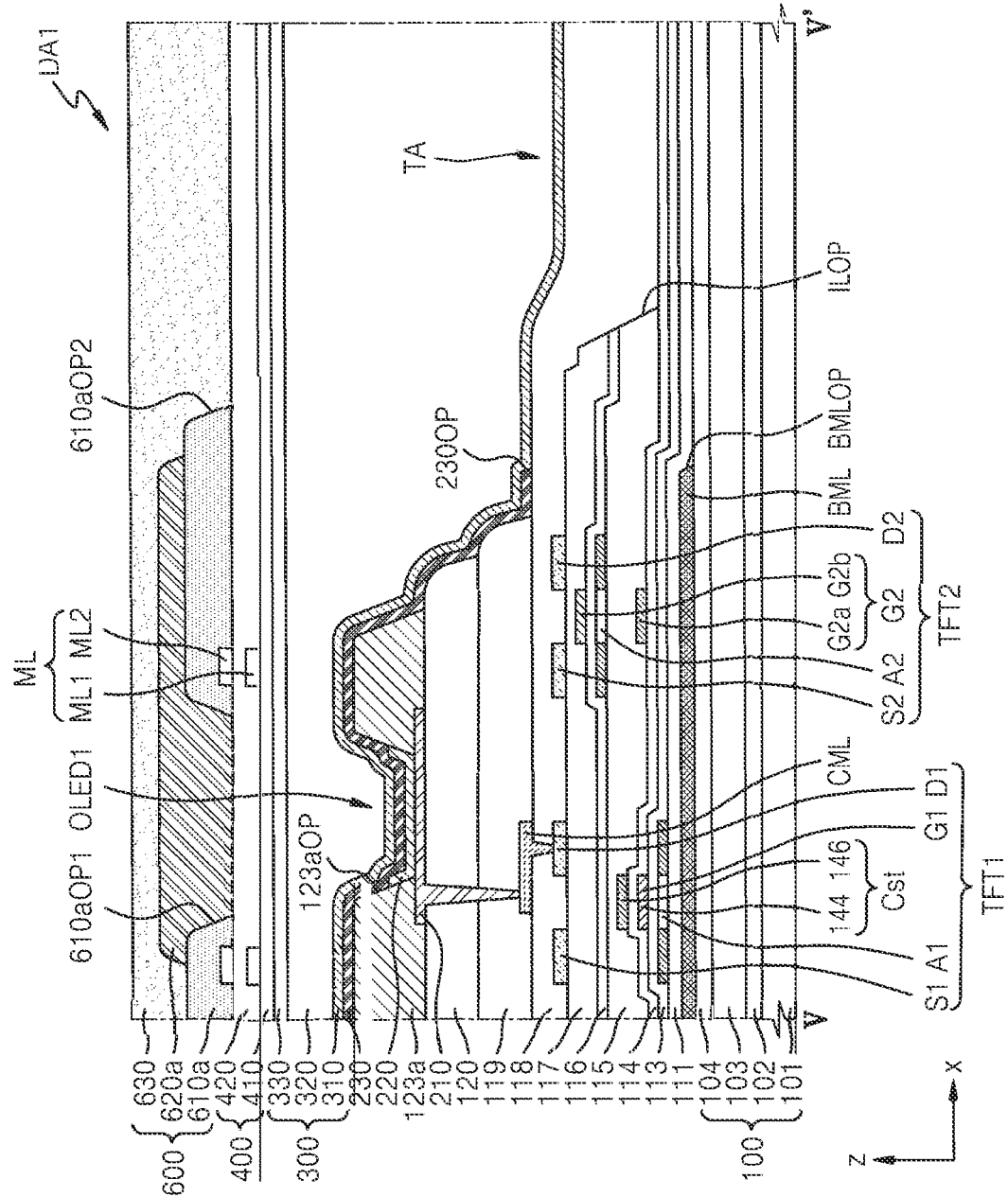
FIG. 19 is a schematic cross-sectional view (of a first display area, which is taken along the line V-V' of FIG. 18.

FIG. 19 is a schematic cross-sectional view of the first display area DA1, which is taken along the line V-V' of FIG. 18. In FIG. 19, like reference numerals as those in FIG. 12 denote like members, and thus, some repeated description thereof may be omitted.

Referring to FIG. 19, according to some embodiments, the encapsulation layer 300, the input sensing layer 400, and the anti-reflection layer 600 may be sequentially arranged on the first organic light-emitting diode OLED1.

According to some embodiments, the encapsulation layer 300 may cover the first organic light-emitting diode OLED1. According to some embodiments, the encapsulation layer 300 may include a first inorganic layer 310, a second inorganic layer 330, and an organic layer 320 therebetween.

The first and second inorganic layers 310 and 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride.

The organic layer 320 may include a polymer-based material. The polymer-based material may include an acrylic resin, an epoxy-based resin, polyimide, and polyethylene. For example, the organic layer 320 may include an acrylic resin such as polymethyl methacrylate, polyacrylic acid, or the like. The organic layer 320 may be formed by curing a monomer or applying a polymer.

The input sensing layer 400 may include a touch electrode, and the touch electrode may include a metal line ML. The touch electrode may include the metal line ML having a mesh structure surrounding the emission area of the first organic light-emitting diode OLED1 on a plane. The metal line ML may include a first metal layer ML1 and a second metal layer ML2. According to some embodiments, the metal line ML may include a connection structure of the first metal layer ML1 and the second metal layer ML2. According to some embodiments, the metal line ML may include any one of the first metal layer ML1 and the second metal layer ML2. The metal line ML may include Mo, mendelevium (Mb), Ag, Ti, Cu, Al, and any alloy thereof. An electrode of the input sensing layer 400, for example, the metal line ML, may be covered by the light-shielding layer 610.

The input sensing layer 400 may include a first touch insulating layer 410 on the encapsulation layer 300 and a second touch insulating layer 420 on the first touch insulating layer 410. The first metal layer ML1 may be between the first touch insulating layer 410 and the second touch insulating layer 420, and the second metal layer ML2 may be arranged on the second touch insulating layer 420.

The first touch insulating layer 410 and the second touch insulating layer 420 may include an inorganic insulating material and/or an organic insulating material.

According to some embodiments, the anti-reflection layer 600 may include a first light-shielding layer 610a, a first color filter 620a, and an overcoat layer 630. According to some embodiments, the first light-shielding layer 610a may at least partially overlap the first light-shielding insulating layer 123a arranged thereunder, and the first color filter 620a may at least partially overlap the pixel electrode 210 arranged thereunder.

According to some embodiments, the first light-shielding layer 610a may cover the aforementioned metal line ML. For example, the first light-shielding layer 610a may directly cover the aforementioned second metal layer ML2. By covering the first light-shielding layer 610a, an insulating layer arranged on the second metal layer ML2 may be omitted, and thus, the process may be simplified and the cost of materials may be reduced.

According to some embodiments, the first light-shielding layer 610a may include an opening overlapping the emission area of the first organic light-emitting diode OLED1. In this regard, FIG. 19 illustrates an opening (hereinafter, a second opening 610aOP1) overlapping the emission area of the first organic light-emitting diode OLED1 and/or the first opening 123aOP of the first light-shielding insulating layer 123a.

A width of the second opening 610aOP1 of the first light-shielding layer 610a may be greater than or equal to the width of the emission area of the first organic light-emitting diode OLED1 and/or the first opening 123aOP of the first light-shielding insulating layer 123a. In this case, light reaching a user's naked eyes, which form an acute angle with respect to an upper surface of the anti-reflection layer 600, may be sufficiently ensured, and thus, side visibility of the display panel may increase. However, embodiments according to the present disclosure are not limited thereto.

The first color filter 620a may be positioned in the second opening 610aOP1 of the first light-shielding layer 610a. The first color filter 620a and light emitted from a light-emitting diode arranged thereunder may have the same color. For example, as illustrated in FIG. 19, when any one first organic light-emitting diode OLED1 of the first display area DA1 emits red light, the first color filter 620a arranged in the second opening 610aOP1 to overlap the aforementioned first organic light-emitting diode OLED1 may include a red color filter. Similarly, when any one first organic light-emitting diode OLED1 of the first display area DA1 emits green light, the first color filter 620a arranged in the second opening 610aOP1 to overlap the aforementioned first organic light-emitting diode OLED1 may include a green color filter, and when any one first organic light-emitting diode OLED1 of the first display area DA1 emits blue light, the first color filter 620a arranged in the second opening 610aOP1 arranged to overlap the aforementioned first organic light-emitting diode OLED1 may include a blue color filter.

The overcoat layer 630 may be arranged over the first light-shielding layer 610a and the first color filter 620a. The overcoat layer 630 is a transmissive layer that does not have a color in a visible light band and may planarize an upper surface of the first light-shielding layer 610a and an upper surface of the first color filter 620a. The overcoat layer 630 may include a transmissive organic material such as an acrylic resin.

According to some embodiments, the first light-shielding layer 610a may include openings (hereinafter, referred to as third openings 610aOP2) corresponding to the transmission area TA. According to some embodiments, a portion of the overcoat layer 630 may be positioned in the third opening 610aOP2. For example, the overcoat layer 630 may at least partially fill the third opening 610aOP2 defined by the first light-shielding layer 610a. According to some embodiments, the transmission area TA may be defined by the third opening 610aOP2 of the first light-shielding layer 610a.

According to some embodiments, at least a portion of the encapsulation layer 300 and the input sensing layer 400 may be arranged on the transmission area TA. For example, at least a portion of the first inorganic layer 310, the organic layer 320, and the second inorganic layer 330 of the encapsulation layer 300 may also be arranged on the transmission area TA. Also, at least a portion of the first touch insulating layer 410 and the second touch insulating layer 420 of the input sensing layer 400 may be arranged on the transmission area TA. However, embodiments according to the present disclosure are not limited thereto.

Figure 20:
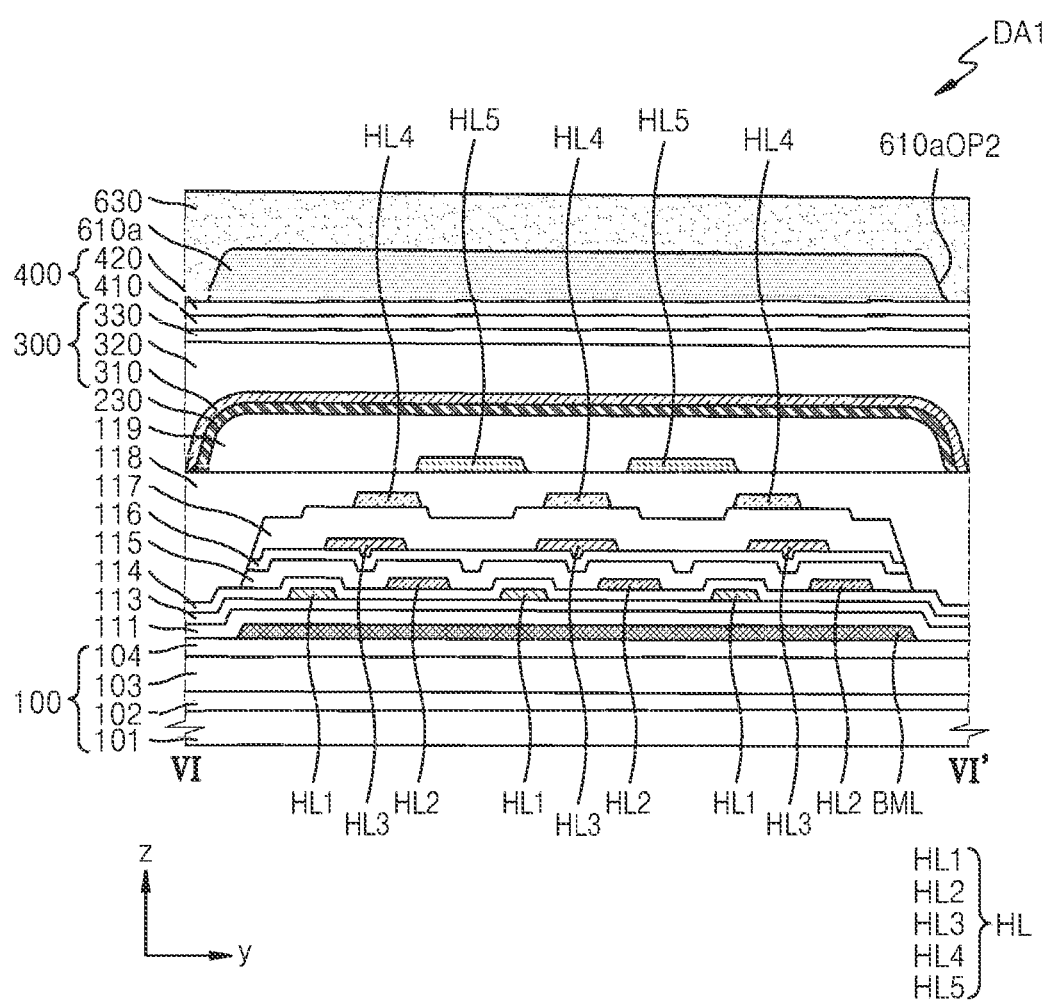
FIG. 20 is a schematic cross-sectional view of a first display area, which is taken along the line VI-VI' of FIG. 18.

FIG. 20 is a schematic cross-sectional view of the first display area DA1, which is taken along the line VI-VI' of FIG. 18. In FIG. 20, like reference numerals as those in FIG. 14 denote like members, and thus, some repeated description thereof may be omitted.

Referring to FIG. 20, the first wire HL may include the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5. The $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5 may be arranged on the blocking metal layer BML.

According to some embodiments, the second organic insulating layer 119 may be arranged on the $(1-5)^{th}$ wire HL5, and the opposite electrode 230 may be arranged on the second organic insulating layer 119. However, embodiments according to the present disclosure are not limited thereto. According to some embodiments, the opposite electrode 230 may be omitted.

According to some embodiments, the encapsulation layer 300 may be arranged on the opposite electrode 230. The encapsulation layer 300 may include the first inorganic layer 310, the organic layer 320, and the second inorganic layer 330. However, embodiments according to the present disclosure are not limited thereto. According to some embodiments, at least one of the first inorganic layer 310, the organic layer 320, or the second inorganic layer 330 may be omitted.

According to some embodiments, the input sensing layer 400 may be arranged on the encapsulation layer 300. The input sensing layer 400 may include the first touch insulating layer 410 and the second touch insulating layer 420. However, embodiments according to the present disclosure are not limited thereto. According to some embodiments, at least one of the first touch insulating layer 410 or the second touch insulating layer 420 may be omitted. According to some embodiments, the metal line ML (see FIG. 19) may be additionally arranged. For example, the first metal layer ML1 may be arranged on the first touch insulating layer 410, and the second metal layer ML2 may be arranged on the second touch insulating layer 420.

According to some embodiments, the first light-shielding layer 610a may be arranged on the input sensing layer 400. According to some embodiments, the first light-shielding layer 610a may at least partially overlap the first wire HL. For example, the first light-shielding layer 610a may completely overlap the first wire HL. For example, the first light-shielding layer 610a may at least partially overlap the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5. For example, the first light-shielding layer 610a may completely overlap the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5.

Because the first light-shielding layer 610a is provided to at least partially overlap the first wire HL, reflection of external light may be prevented or reduced, and contrast of the display panel may be improved.

Though FIG. 20 illustrates that the first light-shielding layer 610a overlaps the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5, the first light-shielding layer 610a may also overlap the $(2-1)^{st}$ wire VL1, the $(2-2)^{nd}$ wire VL2, the $(2-3)^{rd}$ wire VL3, the $(2-4)^{th}$ wire VL4, and the $(2-5)^{th}$ wire VL5. Accordingly, the first light-shielding layer 610a is provided to at least partially overlap the second wire VL, thereby preventing or reducing reflection of external light and improving contrast of the display panel.

According to some embodiments, the first light-shielding layer 610a may include the third opening 610aOP2, and the transmission area TA may be defined by the third opening 610aOP2 of the first light-shielding layer 610a.

Figure 21:
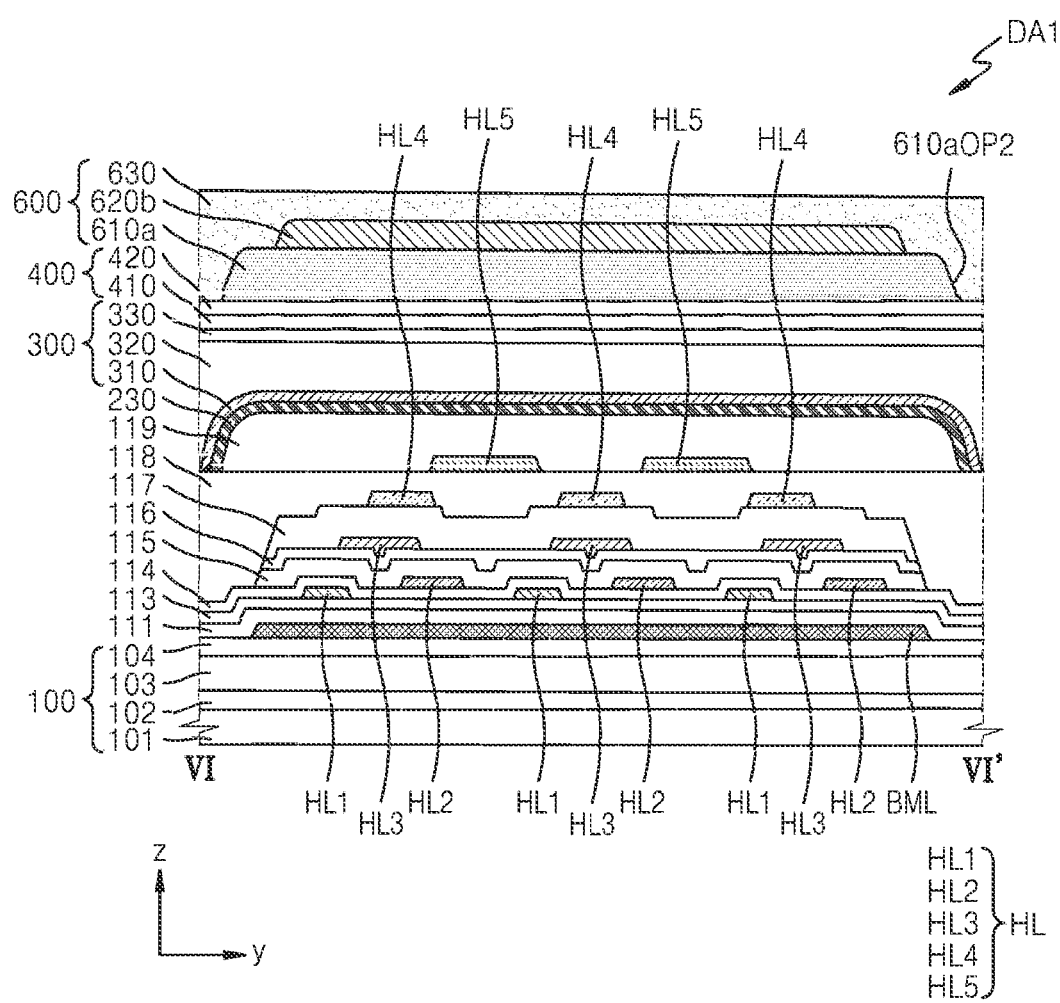
FIG. 21 is a schematic cross-sectional view of a first display area, which is taken along the line VI-VI' of FIG. 18.

FIG. 21 is a schematic cross-sectional view of the first display area DA1, which is taken along the line VI-VI' of FIG. 18. Embodiments described with respect to FIG. 21 differ from the embodiments described with respect to FIG. 20 in that a second color filter 620b is further arranged on the first light-shielding layer 610a. In FIG. 21, like reference numerals as those in FIG. 20 denote like members, and thus, some repeated description thereof may be omitted.

According to some embodiments, the first light-shielding layer 610a may be arranged on the first wire HL, and the second color filter 620b may be arranged on the first light-shielding layer 610a. According to some embodiments, the second color filter 620b may at least partially overlap the first light-shielding layer 610a.

According to some embodiments, the second color filter 620b may at least partially overlap the first wire HL arranged thereunder. For example, the second color filter 620b may completely overlap the first wire HL arranged thereunder. For example, the second color filter 620b may at least partially (or completely) overlap the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5.

According to some embodiments, the second color filter 620b may be a red color filter. However, embodiments according to the present disclosure are not limited thereto. According to some embodiments, the second color filter 620b may be a green color filter or a blue color filter.

Though FIG. 21 illustrates that the second color filter 620b overlaps the $(1-1)^{st}$ wire HL1, the $(1-2)^{nd}$ wire HL2, the $(1-3)^{rd}$ wire HL3, the $(1-4)^{th}$ wire HL4, and the $(1-5)^{th}$ wire HL5, the second color filter 620b may also overlap the $(2-1)^{st}$ wire VL1, the $(2-2)^{nd}$ wire VL2, the $(2-3)^{rd}$ wire VL3, the $(2-4)^{th}$ wire VL4, and the $(2-5)^{th}$ wire VL5.

Accordingly, the first light-shielding layer 610a is arranged on the first wire HL and/or the second wire VL arranged on the first display area DA1, and the second color filter 620b is arranged on the first light-shielding layer 610a, thereby improving black visibility on a screen when an electronic apparatus is powered off.

Figure 22:
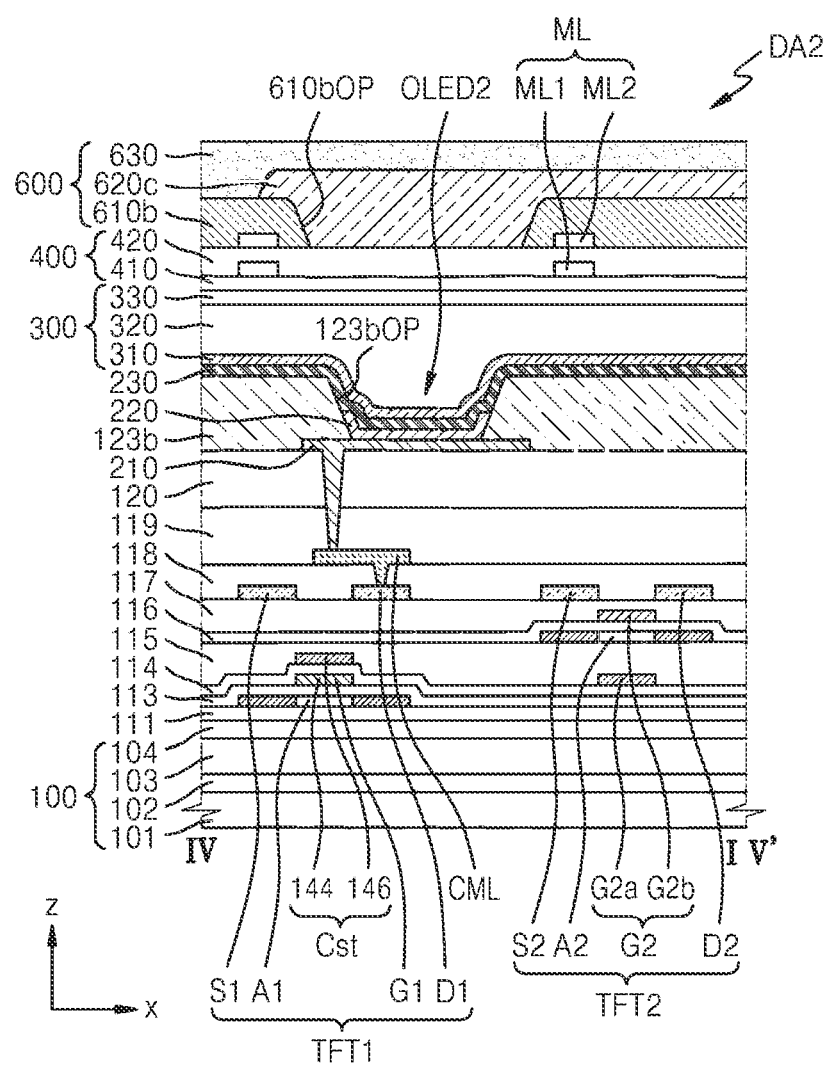
FIG. 22 is a schematic cross-sectional view of a second display area, which is taken along the line IV-IV' of FIG. 16.

FIG. 22 is a schematic cross-sectional view of the second display area DA1, which is taken along the line IV-IV' of FIG. 16. In FIG. 22, like reference numerals as those in FIG. 17 denote like members, and thus, some repeated description thereof may be omitted.

Referring to FIG. 22, according to some embodiments, the encapsulation layer 300, the input sensing layer 400, and the anti-reflection layer 600 may be sequentially arranged on the second organic light-emitting diode OLED2.

According to some embodiments, the encapsulation layer 300 may cover the second organic light-emitting diode OLED2. According to some embodiments, the encapsulation layer 300 may include the first inorganic layer 310, the second inorganic layer 330, and the organic layer 320 therebetween.

The input sensing layer 400 may include the touch electrode, and the touch electrode may include the metal line ML. The touch electrode may include the metal line ML having a mesh structure surrounding the emission area of the second organic light-emitting diode OLED2 on a plane. According to some embodiments, the metal line ML may include the first metal layer ML1 and the second metal layer ML2. According to some embodiments, the metal line ML may include a connection structure of the first metal layer ML1 and the second metal layer ML2. According to some embodiments, the metal line ML may include any one of the first metal layer ML1 and the second metal layer ML2.

According to some embodiments, the anti-reflection layer 600 may include a second light-shielding layer 610b, a third color filter 620c, and the overcoat layer 630. According to some embodiments, the second light-shielding layer 610b may at least partially overlap the second light-shielding insulating layer 123b arranged thereunder, and the third color filter 620c may at least partially overlap the pixel electrode 210 arranged thereunder.

According to some embodiments, the second light-shielding layer 610b and the first light-shielding layer 610a (see FIG. 19) may include the same material, and the third color filter 620c and the first color filter 620a (see FIG. 19) may include the same material.

According to some embodiments, the second light-shielding layer 610b may cover the aforementioned metal line ML. For example, the second light-shielding layer 610b may directly cover the aforementioned second metal layer ML2.

According to some embodiments, the second light-shielding layer 610b may include an opening overlapping the emission area of the second organic light-emitting diode OLED2. In this regard, FIG. 22 illustrates an opening (hereinafter, a fifth opening 610bOP) overlapping the emission area of the second organic light-emitting diode OLED2 and/or the fourth opening 123bOP of the second light-shielding insulating layer 123b.

A width of the fifth opening 610bOP of the second light-shielding layer 610b may be greater than or equal to the width of the emission area of the second organic light-emitting diode OLED2 and/or the fourth opening 123bOP of the second light-shielding insulating layer 123b. In this case, light reaching the user's naked eyes, which form an acute angle with respect to the upper surface of the anti-reflection layer 600, may be sufficiently ensured, and thus, the side visibility of the display panel may increase. However, embodiments according to the present disclosure are not limited thereto.

The third color filter 620c may be positioned in the fifth opening 610bOP of the second light-shielding layer 610b. The third color filter 620c and light emitted from a light-emitting diode arranged thereunder may have the same color. For example, as illustrated in FIG. 22, when any one second organic light-emitting diode OLED2 of the second display area DA2 emits red light, the third color filter 620c arranged in the fifth opening 610bOP to overlap the aforementioned second organic light-emitting diode OLED2 may include a red color filter. Similarly, when any one second organic light-emitting diode OLED2 of the second display area DA2 emits green light, the third color filter 620c arranged in the fifth opening 610bOP to overlap the aforementioned second organic light-emitting diode OLED2 may include a green color filter, and when any one second organic light-emitting diode OLED2 of the second display area DA2 emits blue light, the third color filter 620c arranged in the fifth opening 610bOP to overlap the aforementioned second organic light-emitting diode OLED2 may include a blue color filter.

The overcoat layer 630 may be arranged over the second light-shielding layer 610b and the third color filter 620c. The overcoat layer 630 is a transmissive layer that does not have a color in a visible light band and may planarize an upper surface of the second light-shielding layer 610b and an upper surface of the third color filter 620c. The overcoat layer 630 may include a transmissive organic material such as an acrylic resin.

There is a problem in that, when the first light-shielding insulating layer 123a is arranged on the first and second wires HL and VL, a portion of the first light-shielding insulating layer 123a is torn due to a step.

According to some embodiments, the first and second wires HL and VL and the first light-shielding insulating layer 123a may be arranged on the first display area DA1 under which the component 20 is arranged thereunder, and the first light-shielding insulating layer 123a may be provided not to overlap the first and second wires HL and VL. That is, the first light-shielding insulating layer 123a may have an isolated pattern. Because the first light-shielding insulating layer 123a has an isolated pattern not to overlap the first and second wires HL and VL, tearing of the first light-shielding insulating layer 123a arranged on the first and second wires HL and VL may be prevented, reduced, or minimized.

Also, because the first light-shielding insulating layer 123a has an isolated pattern not to overlap the first and second wires HL and VL, tearing of the first light-shielding insulating layer 123a arranged on the first and second wires HL and VL may be prevented, reduced, or minimized, and thus, performance of the component 20 arranged under the first display area DA1 may be improved. That is, resolution and contrast of a camera may be improved, and defocus characteristics of the camera may be improved.

Also, the first light-shielding insulating layer 123a is not arranged on the first and second wires HL and VL, so that flowability of monomers constituting the organic layer 320 may be improved, and thus, flatness of the organic layer 320 formed in the transmission area TA may be improved. Alternatively, because the first light-shielding insulating layer 123a is not arranged on the first and second wires HL and VL, overall flatness of the first display area DA1 may be improved.

According to some embodiments, the first light-shielding layer 610a is arranged on the first and second wires HL and VL, thereby preventing or reducing the reflection of external light and improving the contrast of the display panel.

Also, according to some embodiments, the first light-shielding layer 610a is arranged on the first and second wires HL and VL, and the second color filter 620b is arranged on the first light-shielding layer 610a, thereby improving the black visibility on the screen when the electronic apparatus is powered off.

According to some embodiments, the reflection of external light may be prevented, reduced, or minimized by using the first and second light-shielding insulating layers 123a and 123b, the first and second light-shielding layers 610a and 610b, and the first and third color filters 620a and 620c, and the contrast of the display panel may be improved.

According to one or more embodiments, a light-shielding insulating layer arranged on an area under which a component is arranged is formed in an isolated pattern, thereby improving characteristics of the component. It should be understood that embodiments described herein should be considered in a descriptive sense only and not for limitation of the presented embodiments.

It should be understood that the embodiments described herein should be considered in a descriptive sense only and not for purposes of limitation. Descriptions of features or aspects within each of the embodiments should typically be considered as available for other similar features or aspects in other embodiments. While aspects of one or more embodiments have been described with reference to the figures, it will be understood by those of ordinary skill in the art that various changes in form and details may be made therein without departing from the spirit and scope of embodiments according to the present disclosure including the following claims, and their equivalents.

What is claimed is:

1. A display panel comprising:
a first display area including display element groups in which first light-emitting diodes are arranged and a transmission area;
a second display area surrounding at least a portion of the first display area and having second light-emitting diodes arranged therein; and
a first light-shielding insulating layer on the first display area and defining an emission area of the first light-emitting diodes,
wherein the first light-shielding insulating layer has an isolated pattern in a plan view.

2. The display panel of claim 1, further comprising a first light-shielding layer and a first color filter on the first light-shielding insulating layer.

3. The display panel of claim 2, wherein the first light-shielding insulating layer includes first openings corresponding to the first light-emitting diodes, and the first light-shielding layer includes second openings overlapping the first openings.

4. The display panel of claim 3, wherein the first color filter is in each of the second openings.

5. The display panel of claim 2, further comprising a first wire and a second wire at the first display area.

6. The display panel of claim 5, wherein at least one of the first wire or the second wire is between adjacent display element groups among the display element groups in the first display area, and
the first light-shielding insulating layer is not on at least one of the first wire or the second wire.

7. The display panel of claim 5, wherein at least a portion of the first light-shielding layer is on the first wire and the second wire.

8. The display panel of claim 7, further comprising a second color filter on the first light-shielding layer,
wherein the second color filter at least partially overlaps at least one of the first wire or the second wire.

9. The display panel of claim 8, wherein the second color filter is a red color filter.

10. The display panel of claim 5, wherein the first light-shielding layer includes a third opening corresponding to the transmission area.

11. The display panel of claim 10, further comprising an overcoat layer on the first light-shielding layer and the first color filter.

12. The display panel of claim 11, wherein at least a portion of the overcoat layer is in the third opening.

13. The display panel of claim 1, further comprising a spacer on the first light-shielding insulating layer.

14. The display panel of claim 2, further comprising an encapsulation layer on the first light-emitting diodes and an input sensing layer on the encapsulation layer,
wherein the input sensing layer includes a first metal layer and a second metal layer.

15. The display panel of claim 14, wherein the first light-shielding layer covers the second metal layer.

16. The display panel of claim 1, further comprising:
a second light-shielding insulating layer defining an emission area of each of the second light-emitting diodes; and
a second light-shielding layer and a third color filter, which are on the second light-shielding insulating layer.

17. The display panel of claim 16, wherein the second light-shielding insulating layer the first light-shielding insulating layer include a same material.

18. The display panel of claim 16, wherein the second light-shielding insulating layer includes fourth openings corresponding to the second light-emitting diodes, and the second light-shielding layer includes fifth openings overlapping the fourth openings.

19. The display panel of claim 18, wherein the third color filter is in each of the fifth openings.

20. An electronic apparatus comprising:
a display panel including a first display area and a second display area, wherein the first display area includes display element groups in which first light-emitting diodes are arranged and a transmission area, and the second display area at least partially surrounds the first display area and has second light-emitting diodes arranged therein; and
a component on a lower surface of the display panel and at least partially overlapping the first display area,
wherein the display panel includes a first light-shielding insulating layer on the first display area and defining an emission area of each of the first light-emitting diodes, and,
in a plan view, the first light-shielding insulating layer has an isolated pattern.

21. The electronic apparatus of claim 20, further comprising a first light-shielding layer and a first color filter on the first light-shielding insulating layer.

22. The electronic apparatus of claim 21, wherein the first light-shielding insulating layer includes first openings corresponding to the first light-emitting diodes, and the first light-shielding layer includes second openings overlapping the first openings.

23. The electronic apparatus of claim 22, wherein the first color filter is in each of the second openings.

24. The electronic apparatus of claim 21, further comprising a first wire and a second wire at the first display area.

25. The electronic apparatus of claim 24, wherein at least one of the first wire or the second wire is between adjacent display element groups among the display element groups in the first display area, and
the first light-shielding insulating layer is not on at least one of the first wire or the second wire.

26. The electronic apparatus of claim 24, wherein at least a portion of the first light-shielding layer is on the first wire and the second wire.

27. The electronic apparatus of claim 26, further comprising a second color filter on the first light-shielding layer,
wherein the second color filter at least partially overlaps at least one of the first wire or the second wire.

28. The electronic apparatus of claim 24, wherein the first light-shielding layer includes third openings corresponding to the transmission area.

29. The electronic apparatus of claim 28, further comprising an overcoat layer on the first light-shielding layer and the first color filter.

30. The electronic apparatus of claim 29, wherein at least a portion of the overcoat layer is in each of the third openings.

31. The electronic apparatus of claim 20, further comprising a spacer on the first light-shielding insulating layer.

32. The electronic apparatus of claim 20, wherein the component includes a sensor or a camera.

* * * * *